United States Patent [19]

Ueno et al.

[11] Patent Number: 5,491,427
[45] Date of Patent: Feb. 13, 1996

[54] PROBE AND ELECTRICAL PART/CIRCUIT INSPECTING APPARATUS AS WELL AS ELECTRICAL PART/CIRCUIT INSPECTING METHOD

[75] Inventors: Toshiaki Ueno; You Kondoh, both of Yokohama, Japan

[73] Assignee: Hewlett-Packard Company, Palo Alto, Calif.

[21] Appl. No.: 288,514

[22] Filed: Aug. 10, 1994

[30] Foreign Application Priority Data

Aug. 21, 1993 [JP] Japan .................................. 5-228263

[51] Int. Cl.[6] .................................................. G01R 31/02
[52] U.S. Cl. ..................... 324/754; 324/158.1; 324/72.5
[58] Field of Search .................................. 324/72.5, 754, 324/158.1

[56] References Cited

U.S. PATENT DOCUMENTS

| | | | |
|---|---|---|---|
| 3,806,800 | 4/1974 | Bove et al. | 324/51 |
| 4,587,481 | 5/1986 | Lischke et al. | 324/74 |
| 4,870,356 | 9/1989 | Tingley | 324/158 |

FOREIGN PATENT DOCUMENTS

| | | | |
|---|---|---|---|
| 0107771 | 9/1983 | European Pat. Off. | G01R 1/073 |
| 0545070A1 | 10/1992 | European Pat. Off. | G01R 1/073 |
| 62-182672 | 1/1986 | Japan . | |

OTHER PUBLICATIONS

January Kister and Robert L. Franch, "Advances in Membrane Probe Technology", IEEE, International Test Conference, Sep., 1992, pp. 927–935.

Brian Leslie and Farid Matta, "Membrane Probe Card Technology", IEEE, 1988 International Test Conference, Sep., 1988, pp. 601–607.

January (Jarek) Kister, and Tammy Fisher; "Probe Technology".

Packard Hughes Interconnect, Product Document at Semicon West '93.

D. J. Herrell, "Chip Test Adapter Lifetime Extension Technique", vol. 26, No. 2, IBM Disclosure Bulletin, New York, USA, p. 485.

Primary Examiner—Kenneth A. Wieder
Assistant Examiner—Mark Wardas

[57] ABSTRACT

An apparatus and method for providing durable, high performance, probing of semiconductor devices having a large number of narrow pitch terminals. A single probe of the present invention provides flexible probing of a wide range of the devices having various sizes and terminal arrangements. In contrast, teachings of the prior art require a separate probe to be manufactured or a probe to be re-formed for each different size and terminal arrangement of the devices. The probe of the invention includes electrodes electrically coupled with a test system in such a way so as to provide the devices to be probed with a selection of more than two arrangements in which device terminals contacting the probe electrodes are not shorted with each other by the probe.

6 Claims, 19 Drawing Sheets

PROBE AND ELECTRICAL PART/CIRCUIT INSPECTING APPARATUS AS WELL AS ELECTRICAL PART/CIRCUIT INSPECTING METHOD

FIELD OF THE INVENTION

The present invention generally relates to electronic probing and more particularly relates to an apparatus and method for wafer probing in a wafer test of LSI devices and for pin probing in a test of multi-pin high density LSI packages.

BACKGROUND OF THE INVENTION

A test system is indispensable for guaranteeing quality of semiconductor devices and other electronic parts and for improving the manufacturing process thereof. While there are many semiconductor test systems in the market (ex. 9480A, 9490 and others manufactured by Yokogawa and Hewlett Packard), an advanced inspection technology is needed.

Because of progress in semiconductor technology relevant design rules, degree of integration and number of pins of I/O tend to increase every year. For example, a gate array having more than 1000 pins and less than 70 micron of pitch is expected to appear in the next few years as shown in FIG. 23 (see "Study on Multi-pin Probe Card" by Ryoichi Takagi, Masahiro Ueda and Tetsuo Tada, National Convention of the Institute of Electronics Information and Communication Engineers (Spring), C-641, 1990). Such rapid increase of the number of terminals and miniaturization of size of terminals will make it more difficult to probe wafer terminal pads in testing them and to probe terminal pins in testing multi-pin high density LSI packages.

In a conventional wire type probe used in a wafer probing apparatus, probe needles (73) are secured on a wired rigid epoxy probe substrate (71) by a ring (72) as shown in FIG. 24. This probe is used in characteristic tests of semiconductor devices by contacting the point of the probe and flowing test signals directly to terminals of the semiconductor device to be measured. While such probes provide some advantages, some limitations remain.

It is difficult to package the probe needles on the substrate in multi-pin narrow pitch because a diameter of the needles is thick. Accordingly, it is difficult to use such a probe to probe wafers having more than 500 terminals, less than 100 micron pitch, and small terminal pad size. Thinning of the probe needles is limited in conventional processing technology.

However, even if the probe needle is thinned by employing a special processing technology, such thinning creates new difficulties. For example, wear due to several tens of thousands times of touchdown increases a contact resistance between the needle point and the terminal of the semiconductor device. Accordingly, it becomes difficult to obtain a stable conductivity. Also cracks are readily created at the needle points. Furthermore, regular cleaning and polishing of the needle points are required because debris of the terminal pads attaches and deposits on the needle points and because the needle points are also abraded.

One of the problems of the wire type probe lies also in its manufacturing method. That is, such probe is manufactured by a method wherein probe needles are adhered and secured one by one, adjusting to positions of terminals of a semiconductor device such as a LSI chip to be inspected. Accordingly, its manufacturing cost increases in proportion to an increase of the number of pins of semiconductor device. Furthermore, a skilled craftsman is required to manufacture such a probe, which limits manufacturing productivity.

By their very nature, such probes need to be reformed for each semiconductor device to accommodate various changes of terminal position and terminal pad size, various changes of size of chip itself, and various changes of semiconductor devices. Such reformation considerably increases total cost, including design cost.

Furthermore, electrical performance of such probes is generally limited, especially for high speed signals.

Though a pitch of probe needles is narrowed down as a pitch of terminals to be probed is narrowed down, a certain degree of length of the needles is still necessary. The length of the needles generally ranges to several centimeters. Due thereto, various problems arise in high frequency characteristic tests of a semiconductor device which operates in high speed. Noise is generated due to a self-inductance of the probe needles, which increases along the thinning of the diameter. Cross-talk between the probe needles increases along the decrease of the pitch of the probe needles. Transmission loss increases due to mismatching of impedances.

On the other hand, a singular wire type probe that can accommodate high frequency waves has been developed. Generally short probe needles are used in this probe, so that the aforementioned problems of the cross-talk and mismatching of impedances are eased. However, it cannot be applied to multi-pin narrow pitch semiconductor devices because a plurality needles are not mounted in bundle as in the case of the wire type probe and because it is used singularly.

Thus it has been very difficult for the conventional wire type probe to accommodate with both multi-pin narrow semiconductor devices and high speed and high frequency semiconductor devices. In order to solve such problems, a membrane probe has been proposed (see International Test Conference Proceedings, IEEE, 1988, pp. 601–607). Line patterns and projecting electrodes (contact bumps) made from metal thin film are formed on the surface of flexible insulative resin film, such as polyimide, using photolithography technology.

Another type of probe is a membrane probe as shown in FIG. 25, wherein contact bumps (83) are formed projecting at the portions where communicating holes (82) are created on one surface of an insulative synthetic resin film (dielectric film) (81). A ground layer (85) is formed on the side where the contact bumps are formed.

The membrane probe can accommodate with a wafer chip having more than 500 terminals and less than 100 micron pitch. An example of a prototype of membrane probe which accommodates with a chip having more than several hundreds pads and less than 100 micron of pitch has been reported.

The contact bumps are analogous to the probe needles of the wire probe shown discussed previously herein. Transmission and receiving of test signals are carried out by contacting them to terminals of a semiconductor device via the line pattern. Because the diameter of the contact bumps is so small as about several tens of microns (i.e. the height of the projection is about a half thereof) as compared to the wire probe, almost no influence of the self-inductance and cross-talk is seen in this portion. Further, because the transmission paths can be structured into a micro-strip line structure which allows match impedance, it is possible to test with less distortion of waveform and cross-talk caused by reflection even when transmitting high speed signals. Still more, it is possible to minimize the cross-talk and transmission loss by providing the ground layer and by optimally designing the width of transmission lines and the pitch between the transmission lines.

However, the membrane probe described above has limitations because it is manufactured using a photolithographic technology, metallic materials cannot be freely selected and that it is difficult to implement such a process as hardening, differing from the case when probe needles are used. That is, metals which can be selected are limited for such a process as plating often used in creating the bumps and a high temperature heat process cannot be implemented because a synthetic resin film is used. Accordingly, the membrane probe is limited in terms of the high hardening of the contact bumps and has a problem in its durability.

As for the durability, there is a problem not only in the contact bumps, but also in the synthetic resin film. Generally, a material such as polyimide is often used for the synthetic resin film, but such synthetic resin film readily decomposes and changes its hardness and elastic modulus depending on an environment.

Because the wire probe can be used almost semi-permanently except the case when cracks and abrasion of the needle point are caused, the durability of the membrane probe is predicted to be inferior as compared to the wire probe. In order to solve these problems, it is conceivable to mass produce disposable membrane probes taking advantage of the photolithographic technology. Presently, however, the manufacturing cost of the membrane probe per sheet is high and it is not widely used.

The largest disadvantage of the membrane probe is its manufacturing cost. As with the wire probe, the membrane probe also needs to be reformed for each semiconductor device to accommodate with changes of position and size of pads and changes of size of semiconductor device itself. This means that masks for photolithography need be reformed and normally, at least three or four masks need to be re-designed and re-manufactured. Although the photo-lithographic technology is suited for producing the same item in a large quantity and economies of scale provide cost reductions, the cost becomes higher when the process needs to be built for each semiconducter device.

Although the cost of the membrane probe will not become high in proportional to the increase of the number of pins, differing from the wire probe, the cost of the membrane probe is almost the same or higher than that of the wire probe when the number of pins is around 500. The merit of the cost of this method is considered to appear when the number of pins is more than 1000.

As pointed out previously, conventional probes such as the wire probe and the membrane probe are custom designed or re-formed for each semiconductor device. However, a semiconductor device manufacturer often will not disclose the information needed to create the probe design, such as size of chip and arrangement of pads. This is because technology level of the device can be estimated from the size of chip, the number of I/O pins, and arrangement of pads. Accordingly, such disclosure is contrary to security interests of the semiconductor device manufacturer and their wish to keep an advantage in competition with other manufacturers.

As discussed herein, among the conventional probes, the wire probe has limitations in probing multi-pin narrow pitch devices and those which operate at high speeds and at high frequencies. Although the membrane probe using photo-lithographic technology can accommodate probing of multi-pin narrow pitch devices and of those which operate in high speed and in high frequency, its cost is high because photo-masks need to be reformed and process needs to be rebuilt for each semiconductor device, resulting in increased manufacturing and maintenance costs. What is needed is a probe that provides durable, high performance probing of narrow pitch devices, but does not require a separate probe to be manufactured for each one of various sizes and pad arrangements of the devices.

SUMMARY OF THE INVENTION

A probe of the present invention provides durable, high performance, probing of semiconductor devices having a large number of narrow pitch terminals. A single probe of the present invention provides flexible probing of a wide range of the devices having various sizes and terminal arrangements. In contrast, teachings of the prior art require a separate probe to be manufactured or a probe to be reformed for each different size and terminal arrangement of the devices.

Briefly and in general terms the probe of the present invention comprises a circuit substrate and probe electrodes disposed on the surface of the substrate. The invention includes a means for electrically coupling the probe electrodes with a test system in such a way so as to provide the devices to be probed with a selection of more than two arrangements in which device terminals contacting the probe electrodes are not shorted with each other by the coupling means. Therefore the invention does not require that probe be reformed or manufactured for each semiconductor device wafer or packaged semiconductor device. Accordingly, the probe of the invention flexibly accommodates changes in position and size of device terminal pads or packaged device terminal pins, as well as changes in size of the semiconductor devices. Furthermore, the invention provides an advantage to probe makers that the probe of the invention can be fabricated without obtaining detailed information on arrangement of terminal pads of a semiconductor device. A probe grid pattern in the present invention inherently includes various one- or two-dimensional probing arrangements.

Even if some of the probe electrodes fail or become defective, the novel grid pattern and electrical interconnection of the probe electrodes still provide flexible probing while avoiding use of failed or defective probe electrodes. Accordingly, a usable life of the probe is advantageously prolonged by adjusting the alignment of the probe electrodes and the device to be probed by about the pitch of the probe electrodes or by a multiple thereof.

In a preferred embodiment of the probe, the probe electrodes arranged on the surface of the substrate in a plurality of columns for probing the semiconductor device. Each probing column extends outwardly from a central portion of the substrate surface towards a perimeter of the substrate surface. A plurality of line patterns is preferably disposed on the surface of the circuit substrate of the probe. Each line electrically interconnects the electrodes of a respective one of the probing columns. By centrally aligning the electrodes disposed on the substrate surface with the device terminals, a respective probing column is selected for each terminal of the device. A respective selected electrode is pressed into electrical contact with each terminal of the device, thereby providing electrical coupling between each device terminal and the respective selected probing column.

Preferably, the probing columns of electrodes are formed in a one-dimensional or two-dimensional grid pattern on a surface of a circuit substrate. Additionally, it should be understood that the electrodes are formed in a spaced relation on the substrate for contacting the devices to be probed. Preferably, the probe electrodes are formed at equal intervals and a pitch of the electrodes may have a relationship with a minimum pitch of the terminals of the devices to be probed.

In an another preferred embodiment of the invention, probe electrodes are arrayed in a grid pattern at a contact region with the device to be probed, and a signal path switching means couples the electrodes with the test system. Various switching means such as a semiconductor switch, mechanical switch (such as those manufactured by a reed relay micro:machining technology) or the like may be used for the signal path switching means. The signal path switching means is flexibly configured to appropriately couple the grid array of the probe electrodes with the test system, based upon an arrangement of terminals of device to be probed. Necessary test connections among the connections between the probe electrodes and terminals are linked with the test system by closing one or more switches of the signal path switching means. Unnecessary connections are cut off from the test system by opening one or more switches of the signal path switching means, preferably by melting a fuse connection or the like using a certain current flow, for example. When the probe is applied to the electrical part/ circuit test system, measuring means is connected to each of the probe electrode. When a plurality of probe electrodes is contacting with one terminal, the signal path switching means connected to each probe electrode is switched to select one measuring means among the measuring means connected to those probe electrodes. Further, any terminal may be connected to a desired measuring means by constructing the signal path switching means as a matrix type switch group.

A probing method of the invention comprises providing the probe as discussed previously herein, pressing the electrodes in contact with the semiconductor devices, and electrically coupling the electrodes with a test system in such a way so as to provide the devices to be probed with a selection of more than two arrangements in which device terminals contacting the probe electrodes are not shorted with each other.

Other aspects and advantages of the present invention will become apparent from the following detailed description, taken in conjunction with the accompanying drawings, illustrating by way of example the principles of the invention.

Figure 24:
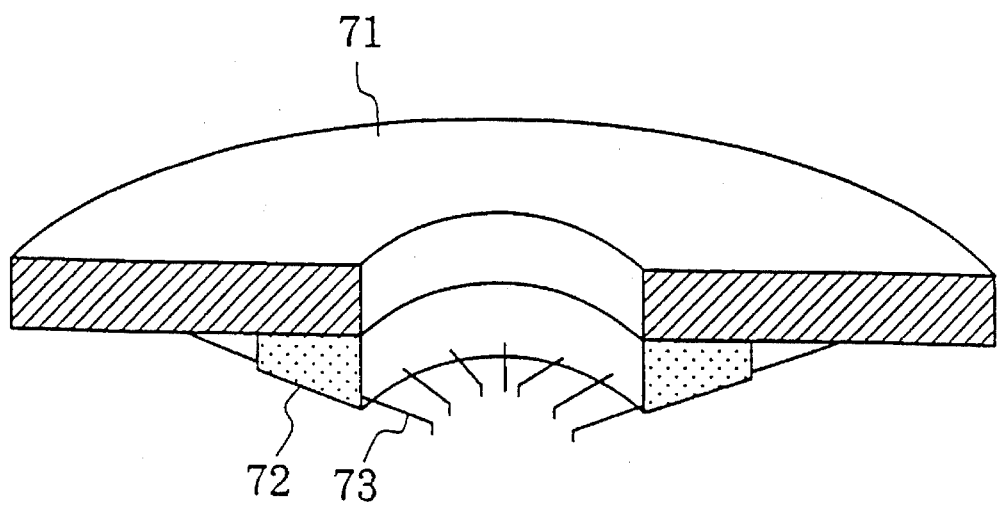

A conventional type wire probe is shown in FIG. 24.

Figure 25:
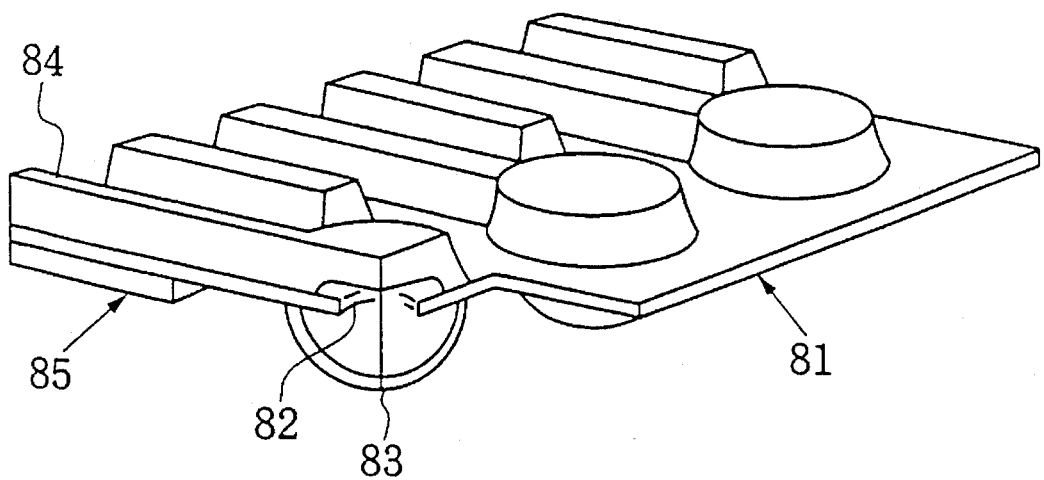

FIG. 25 shows an outline of a membrane probe according to the prior art.

DETAILED DESCRIPTION OF PREFERRED EMBODIMENTS

In the probe of the present invention conductive probe electrodes are formed in a one-dimensional or two-dimensional grid pattern on a surface of a circuit substrate on which a plurality of line patterns are formed and which is used for a device to be probed on which terminals are formed with a regular pitch. A first technological concept (A) of the invention is that each of the line patterns is formed radially while shorting certain electrodes among the probe electrodes and is formed so that the device to be probed can select more than two arrangements in which each of the terminals is not shorted with each other by the line pattern facing to lo the circuit substrate face. Another technological concept (B) of the invention is that the probe electrodes are arrayed in a grid pattern at the contact region with the device to be probed via a signal path switching means. The probes described above in (A) and (B) are based on respective technological concepts that are not mutually exclusive. Accordingly, those probes in (A) and (B) may be implemented regardless of each other or may be implemented in a mode including both technological concepts of (A) and (B), as described in further detail later herein.

In the probe in (A) described above, the line pattern can be formed radially from about the center of the circuit substrate toward the periphery while shorting certain electrodes with each other, among the probe electrodes. Here, the word 'radial' means a state radiating to at least more than two directions (e.g. two, three, four directions).

Although the probe electrodes are preferred to be projecting electrodes in the present invention, they may be flat electrodes or concave electrodes when the terminals formed on the device to be probed protrude from the device. The probe electrodes formed in the grid pattern are preferably formed at equal intervals. A pitch P of the electrodes may have a relationship with a minimum pitch p of the terminals formed on the device to be probed expressed as: P=p/n, where n is a counting number, (n=1, 2 . . . ).

The probe in (A) described above can be favorably used especially in an electrical part/circuit test system such as a semiconductor test system. In semiconductor devices and parts packaged on small face, terminals are often formed so as to meet a certain rule corresponding to a pitch of terminals on the device to be probed. Due thereto, the probe can accommodate with most of the present semiconductor devices when it is applied to a group of the semiconductor devices that meets the certain rule. Accordingly, it allows to be released from such trouble that a probe needs to be reformed for each semiconductor device or packaged parts so that it can accommodate with changes of position and size of pads and changes of size of chip. Furthermore, it brings about a merit to probe makers that it can be fabricated without obtaining such detailed information on arrangement of pads of an LSI device.

Because it is one of the objects of the present invention to construct means for providing such function, the conductive probe electrodes needs not be necessarily arrayed at equal intervals. The grid array of the present invention is not confined to those on a rectangular coordinate, and may be what corresponds to a group of semiconductor devices to be measured which meets a desired rule. Accordingly, the grid pattern in the present invention inherently includes various one- or two-dimensional grid arrays.

Even if some of the probe electrodes fail or become defective, the novel grid array and wiring connection of the probe electrodes in (A) described above allows to avoid use of failed or defective probe electrodes, and to prolong a usable life of the probe just by changing a relative position of the probe and the device to be probed by about the pitch of the probe electrodes or by several times thereof at most.

In the probe in (B) described above, various switching means such as a semiconductor switch, mechanical switch (such as those manufactured by a reed relay micro-machining technology) or the like may be used for the signal path switching means.

The grid array of the probe electrodes may be appropriately changed corresponding to an arrangement of terminals of a device to be probed. For example, when the device to be probed is a square semiconductor device, such a probe may be used on which probe electrodes are formed on the whole area of a region that corresponds to the square. When the terminals are arrayed along four sides of the device to be probed, such a probe may be used on which probe electrodes are formed only on the appropriate region. Furthermore, the grid array may be a one-dimensional array or two-dimensional array.

In the probe in (B) described above, necessary connections among the connections between the probe electrodes and the test system are linked by closing the signal path switching means and unnecessary connections are cut off by opening the signal path switching means.

Normally, the signal path switching means are composed of switches which are appropriately switched every time when the type or the like of a device to be probed is changed. When it is obvious that the type of a device to be probed will not be changed for example, the signal path switching means may be constructed by such means as a fuse which can fuse and cut off the signal path. In this case, a contact point of the probe electrodes with the terminals can be selected by fusing unnecessary conductive parts by melting the fuse or the like by flowing a certain current for example. Additionally, such technology is known also in the field of semiconductor memory.

In the probe in (B) described above; an interval b between the grids of the probe electrodes is sized so as to meet a condition b≦w, where w is a width of the terminals formed on the device to be probed.

That is, in this case, at least one probe electrode always contacts with the terminal of the device to be probed. When more than two probe electrodes contact with one terminal, normally only signal path switching means connected to one probe electrode is closed and signal path switching means connected to another probe electrode is opened.

When the probe in (B) described above is applied to an electrical part/circuit test system, measuring means is connected to each of the probe electrode and when a plurality of probe electrodes is contacting with one terminal, the signal path switching means connected to each probe electrode is switched to select one measuring means among the measuring means connected to those probe electrodes. Further, any terminal may be connected to a desired measuring means by constructing the signal path switching means as a matrix type switch group.

When the signal path switching means opened is connected to the terminal through the probe electrode and when a signal handled is a high frequency wave, the signal propagating through the closed signal path switching means is reflected at the opened signal path switching means and may cause such an ill effect that noise is mixed in the transmitted signal. In such a case, it is preferable to determine a distance L between the probe electrode and the signal path switching means, using a condition:

$$L \leq (t_r/2) * C_o (\text{epsilon } _{\textit{eff}})^{\frac{1}{2}}$$

where $t_r$ is a rise time of the signal passing through the switching means, $C_o$ is light velocity ($3.0 \times 10^8$ m/s), and epsilon $_{\textit{eff}}$ is a dielectric constant around a wire connecting the probe electrode and the signal path switching means.

Further, according to the present invention, the probe electrodes and signal path switching means may be formed on the same substrate such as a silicon substrate. Thereby, it becomes easy for the distance L between the probe electrodes and the signal path switching means to meet the condition.

While probes need to be fabricated corresponding to a size and position of terminals for each type of objects to be contacted in the prior art probes, the probe of the present invention (including the probes in (A) and (B) and in the various modes described above) allows elimination of such inconvenience, can be applied to tests of various kinds of devices just by one probe, and allows sharing one measuring circuit.

In the probe of the present invention (including the probes in (A) and (B) and in the various modes described above), it is preferred to form the probe electrodes as projecting electrodes which are formed at least one surface of an insulative flexible synthetic resin film and to form line patterns connected to those projecting electrodes in a monolayer or multi-layer film.

When the projecting electrodes are formed on both sides of the synthetic resin film, they may be used by appropriately turning the film faces over. In this case, one of line pattern groups formed as separate groups may be connected to the projecting electrodes on one surface described above and the other group may be connected to the projecting electrodes formed on the other side.

It is also possible to connect one group of line patterns so as to be shared by the projecting electrodes formed on one face and those formed on the other face. In terms of impedance matching, a certain line width is necessary for the line patterns. Due thereto, there is a limit in the densification of the line patterns, but such inconvenience is advantageously reduced by forming multi-layer line patterns.

The projecting electrodes may be formed on both sides of the synthetic resin film also in this case as a matter of course and the projecting electrodes formed on both sides may be even connected to line patterns formed on a different layer. The projecting electrodes formed on both sides of the synthetic resin film may also share a ground plane and power source plane (which form parts of a line pattern layer of the multi-layer).

Such probe that uses the synthetic resin film as described above keeps cost low by taking advantage of mass production using photolithographic technology. In this case, the low durability which has been a weak point of the conventional membrane probe may be compensated by providing a disposable synthetic resin film.

The invention is preferably constructed so that the probe is formed into a tape to allow to wind around a reel and to feed successively so as to repeat a probe electrode pattern. That is, the probes in (A) and (B) and in the various modes described above can be formed around a reel with the same technology with the prior art technology for film carriers for TAB (Tape Automated Bonding). It allows to form the probes on a carrier, instead of adhering IC chips on the carrier, and to connect the probe and the device to be probed (for the measurement).

The flexible synthetic resin film can be pressurized and contacted with the terminal forming face of the device to be probed via an elastic body. It allows to obtain a good contact even if there is an irregularity on the terminal forming face of the device to be probed. Additionally, the pressurizing force in contacting them may be suppressed to a minimum by forming the elastic body corresponding to the size of the contact face and arrangement of the terminals of the device to be probed.

A function for mechanically and electrically connecting/disconnecting it to/from the main apparatus may be provided to the probe of the present invention to allow it to be easily replaced.

The present invention is constructed basically using the probes in (A) and (B) (including the various modes described above). It can be also constructed so that the device to be probed can be moved to a position separated by one radial line pattern to allow the terminal faces of the device to be probed to contact with probe electrodes formed on a different radial line pattern. It is also possible to construct it so that the device to be probed and the probe electrodes are relatively moved so that the terminals of the device to be probed can contact with different probe electrodes to allow the probe and the object to select more than two different arrangements.

An electrical part/circuit inspecting method of the present invention is characterized in that it comprises steps of contacting the probe electrodes of the probes in (B) (including the various modes described above) in which the probe electrodes are formed into the grid pattern with the terminal faces of the device to be probed in an arrangement in which the terminal faces will not short each other via the line patterns, and of selecting and using necessary terminals among the terminals led out of the probe.

An electrical part/circuit inspecting method of the present invention comprises steps of contacting the probe electrodes of the probes in (B) (including the various modes described above) in which the signal path switching means are connected to the probe electrodes with the terminal faces of the device to be probed and of selecting and using necessary terminals among the terminals led out of the probe and is characterized in that the signal path switching means connected to those necessary terminals are closed and the other signal path switching means connected via the terminal faces of the object are opened.

Referring now to the drawings, the preferred embodiments of the present invention will be further explained.

Figure 1:
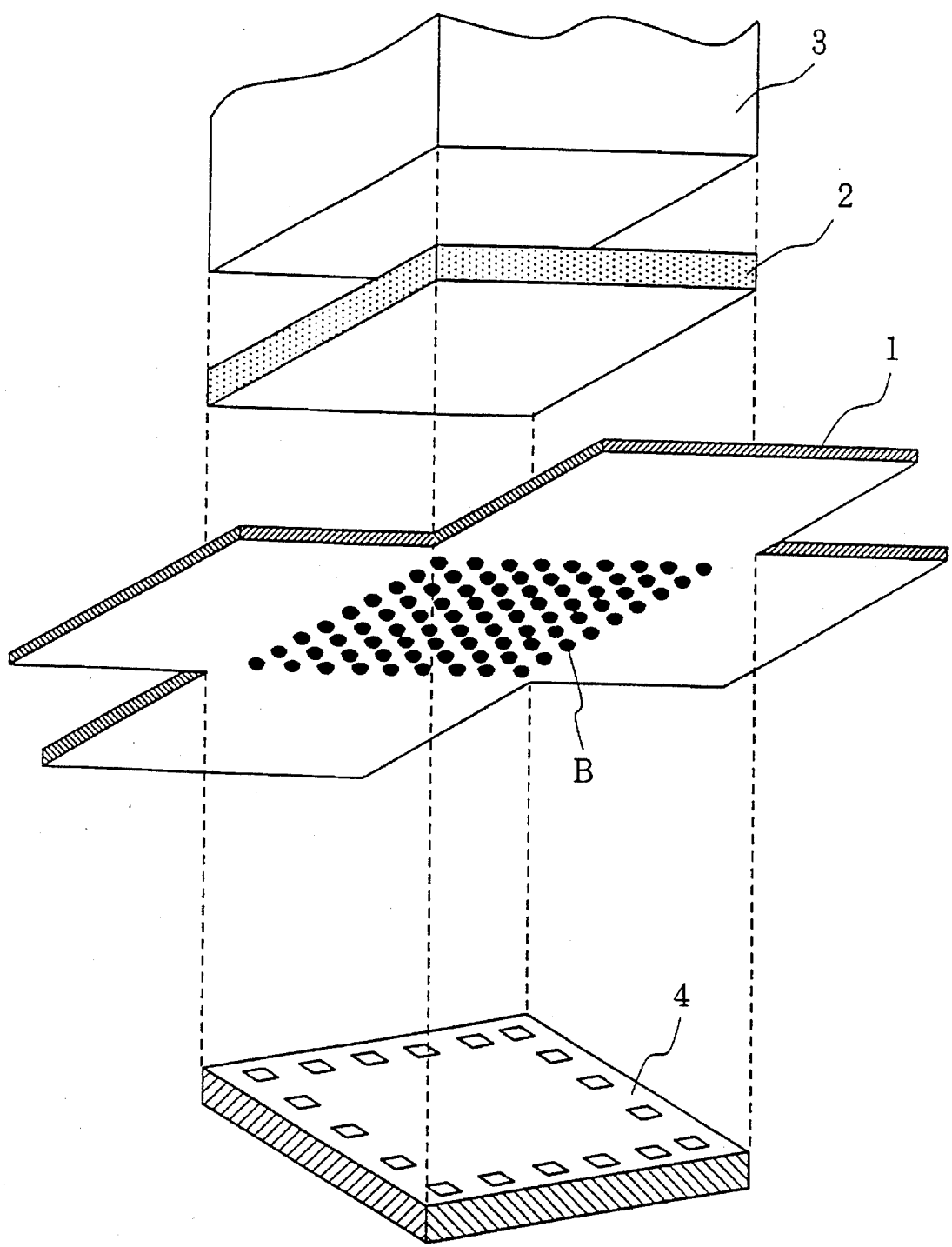
FIG. 1 is an exploded view of a preferred embodiment of the probe of the invention.

FIG. 1 is an explanatory drawing showing one embodiment of the probe of the present invention. As shown in an exploded view of FIG. 1, the probe includes a circuit substrate comprising a film probe 1. The probe further includes an elastic body 2 and an alignment and pressurizing body 3. Probe electrodes (contact bumps as projecting electrodes in this embodiment) B are formed in a grid pattern on the surface of the film probe 1. The body 3 aligns and pressurizes contact of the probe electrodes B with device terminals disposed on an active face of a device to be probed (for example an LSI chip 4 to be measured as shown in FIG. 1).

Figure 2:
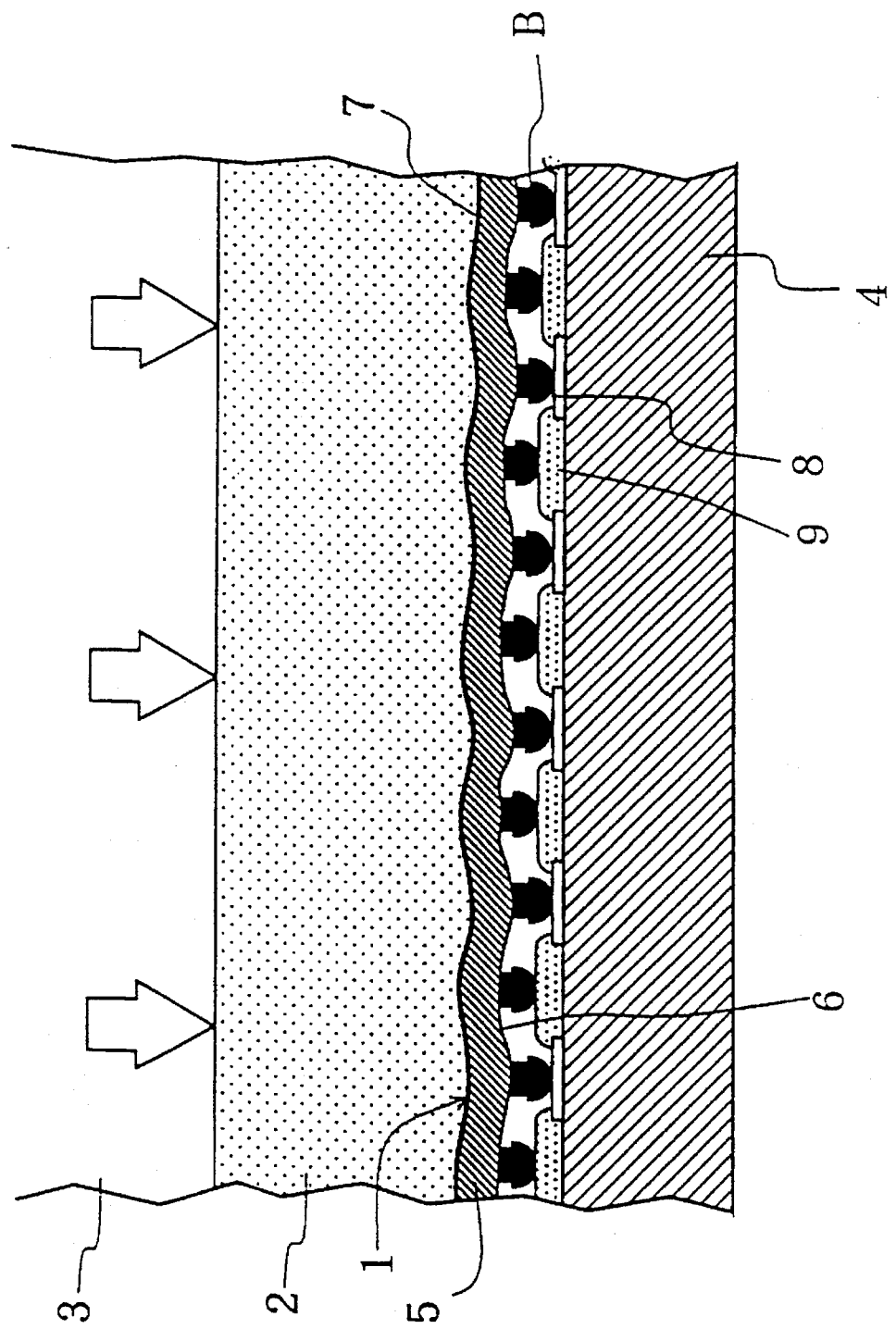
FIG. 2 is a detailed side view illustrating use of the probe of FIG. 1.

FIG. 2 is a detailed side view illustrating use of the probe of FIG. 1. As shown, the probe electrodes B are aligned and pressurized in contact with the surface of the LSI chip 4. The film probe 1 comprises a thin and flexible synthetic resin film 5, such as polyimide. A number of conductive probe electrodes B are formed on a front side of the film 5 facing to the LSI chip 4. A conductive layer (line pattern 6 and ground plane 7) formed on both faces of the synthetic resin film 5. In the case of this embodiment, the whole thickness of the film probe 1 is less than 50 microns and it is very soft and flexible.

The elastic body 2 mechanically coupled with a rear side of the film 5 has an adequate thickness and hardness so that the electrodes B contacting the device 4 accommodate irregularities on the surface of the device 4. Generally, terminals 8 formed on the LSI chip 4 are made from aluminum and their thickness is around 1 micron. Further, a passivation film 9 is formed between neighboring terminals 8 about 2 to 3 micron thick in FIG. 2, so that irregularities on the surface of the LSI chip 4 generally measure about 1 to 2 microns. By controlling a degree of the pressure applied by the body 3, hardness of the probe electrode B and thickness and elastic modulus of the elastic body 2, a good electrical connection with the terminals 8 is obtained, while absorbing such irregularities and avoiding damage to the passivation layer 9 and the active portions (not shown) formed on the LSI chip 4. Generally, a natural oxide film is formed on the surface of the aluminum terminal. This natural oxide film is an insulator and becomes an obstacle in obtaining a good conductivity in probing the chip. This natural oxide film is broken by scrubbing the surface of the device terminal pads with the probe electrodes when they touch down onto the device terminal pads. However, such a measure as described subsequently herein is necessary when a large pressure is applied.

In the film probe of the present invention, the probe electrodes B are provided also at other portions which do not contact with the terminals 8. Therefore, the number of the probe electrodes B is greater than that of a conventional membrane probe. Further, a pressure of about 10 g per one bump is considered to be necessary in order to obtain a good conductivity, though it cannot be determined indiscriminately because it depends on the shape and hardness of the probe electrodes B. Accordingly, for 1000 probe electrodes, a pressurizing force of 10 kg is required. Although the apparatus may become large if the pressurizing force is increased, it can be prevented by taking a measure as follows.

That is, the pressure applied to extra portions (ones among the probe electrodes B which do not contact with the terminals) may be minimized by preforming the shape of the elastic body 2 so as to accommodate with the size and arrangement of the terminals 8 of the LSI chip 4 before contacting the LSI chip 4. Although the preforming the elastic body 2 deviates from the concept of the disposable film probe because it needs to be prepared for each type of LSI chip, actually it is not costly at all as compared to the cost to reform the probe itself for each LSI chip. Furthermore, the cost of the apparatus may be reduced further because the life of the elastic body 2 is expected to be long as compared to the film probe 1 and if several patterns are prepared from the beginning without creating it for each chip.

Figure 3A:
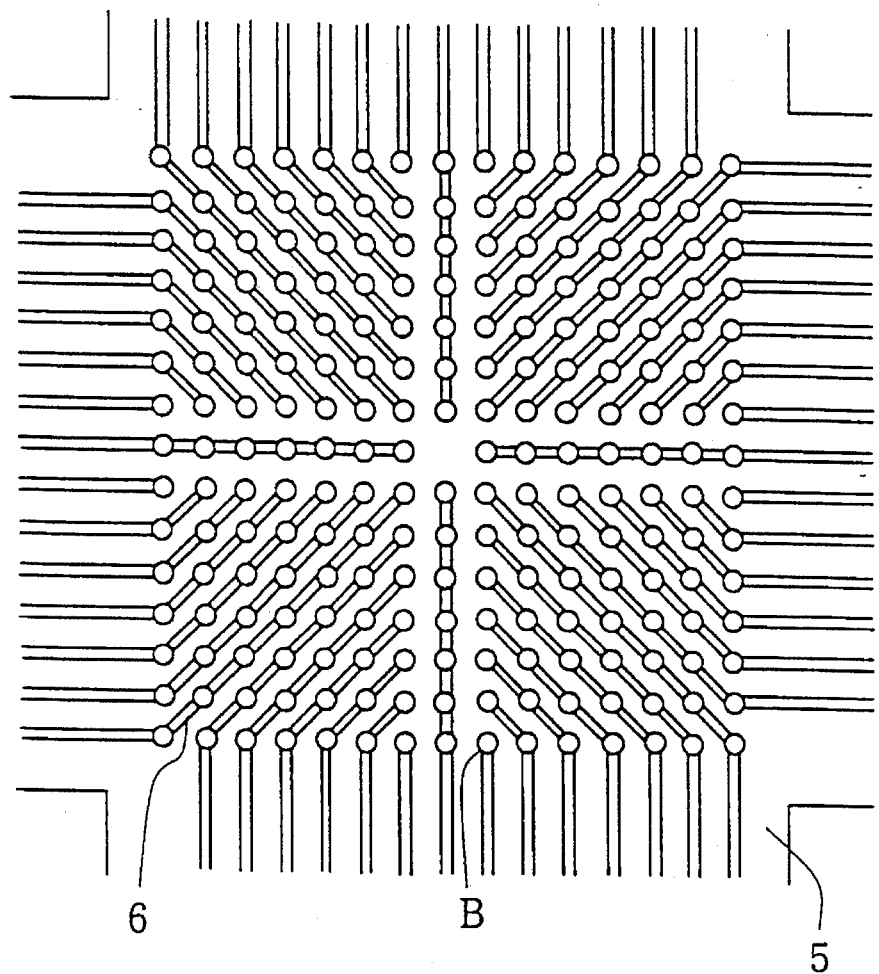
FIG. 3A is a detailed plan view of the probe of FIG. 1.

FIG. 3A is a detailed plan view of the probe of FIG. 1. As shown, the probe electrodes B are arranged on the surface 5 of the substrate in a plurality of columns for probing the semiconductor device. As shown in FIG. 3A, each probing column extends outwardly from a central portion of the substrate surface towards a perimeter of the substrate surface. A plurality of line patterns 6 is preferably disposed on the surface of the circuit substrate of the probe. Each line electrically interconnects the electrodes of a respective one of the probing columns. As shown, the line patterns 6 are formed radially from the center to the peripheral portions and certain probe electrodes are radially connected with each other.

Figure 3B:
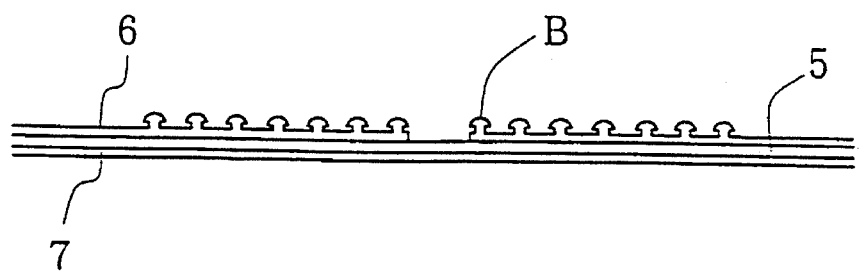
FIG. 3B is a detailed side view of FIG. 3A.

FIG. 3B is a detailed side view of FIG. 3A. As shown, the ground plane 7 is provided on the back. This structure allows to match impedance of the line patterns 6 and to test the device using high frequency signals. Enhanced visual observation of the LSI chip and electrode positioning are provided by using a transparent electrode material for the ground plane 7 or by removing portions of the ground plane where the electrode bumps are formed.

Figure 4A:
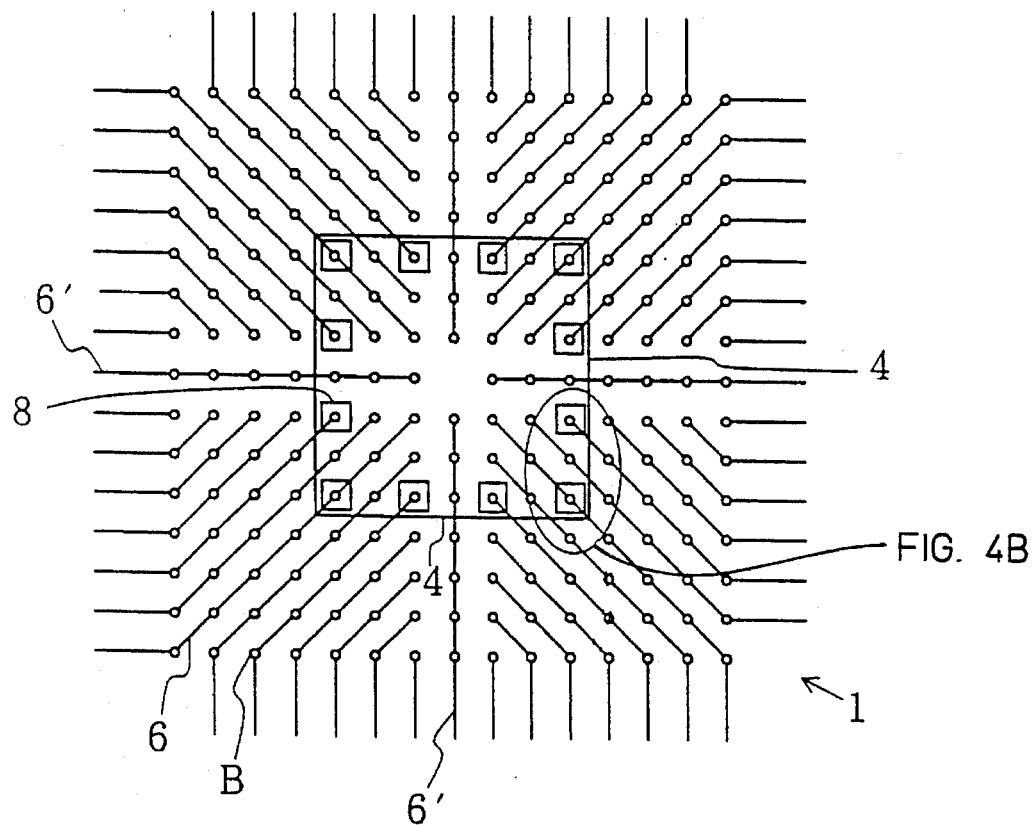
FIG. 4A is a detailed plan view illustrating use of the probe of FIG. 1.

FIG. 4A is a detailed plan view illustrating use of the probe of FIG. 1. As illustrated, the film probe 1 contacts with the LSI chip 4. By centrally aligning the electrodes disposed on the substrate surface with the device terminals, a respective probing column is selected for each terminal of the device. A respective selected electrode is pressed into electrical contact with each terminal of the device, thereby providing electrical coupling between each device terminal and the respective selected probing column. Although the probe electrodes B are formed homogeneously even in the center portion in the figures, the line patterns 6 and the probe electrodes B need not necessarily be formed at the center, so long as terminals of the LSI device are contacted by the probe electrodes and the device terminals are not shorted together by the line patterns interconnecting the electrodes.

Figure 4B:
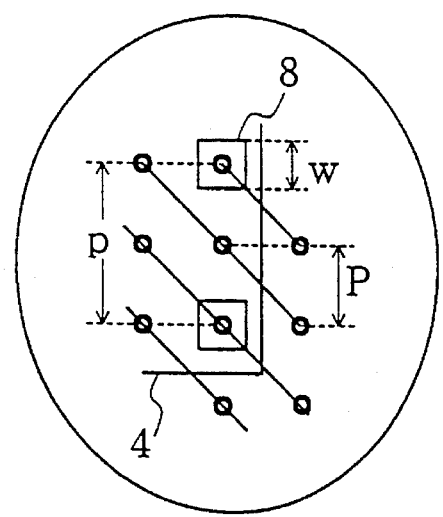
FIG. 4B is a diagram showing a further detailed view of FIG. 4A.

FIG. 4B is a diagram showing a further detailed view of FIG. 4A. As shown, the terminal pads of the device have a dimension w and a pitch p. For example, the dimension w provides a size of the terminal pads 8 of the LSI chip 4 that is assumed to be 100×100 microns, while the pitch p is assumed to be 200 microns. This is a general type LSI chip close to a square, and it can be seen that one line pattern 6 always corresponds to the terminal 8 one by one.

Figure 5:
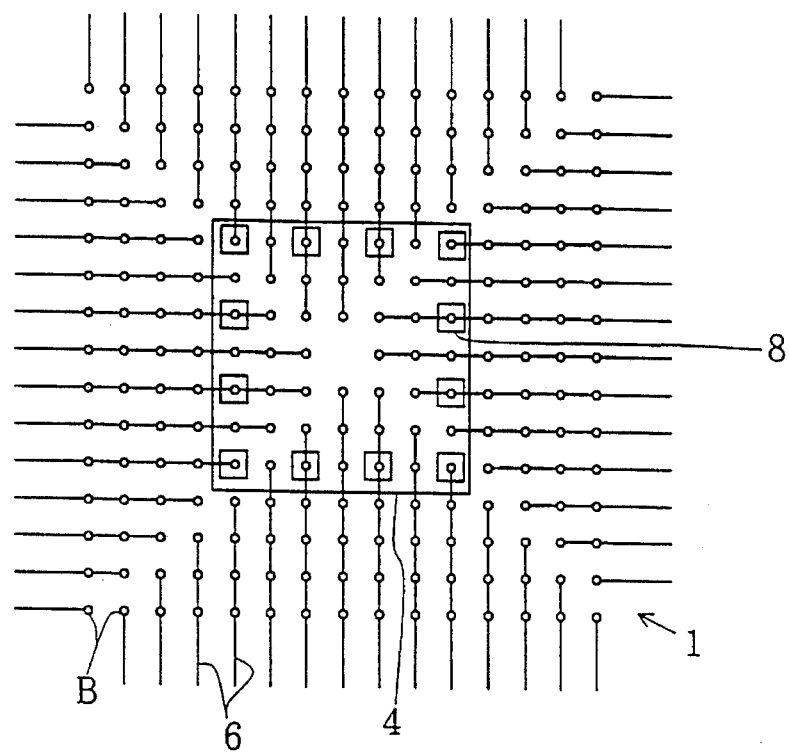
FIG. 5 is a diagram showing alternative line patterns interconnecting electrodes probing a square device.

As seen in FIGS. 4A and 4B, the line patterns 6 in the present invention are wired radially from around the center to the outside. FIG. 5 is a diagram showing alternative line patterns interconnecting electrodes probing a square device. The probe having such a pattern as shown in FIG. 5 is also included in the technological scope of the present invention. In the case of FIG. 5, one line pattern 6 always corresponds to the terminal 8 one by one when the square LSI chip 4 contacts with the center of the film probe 1.

Figure 6:
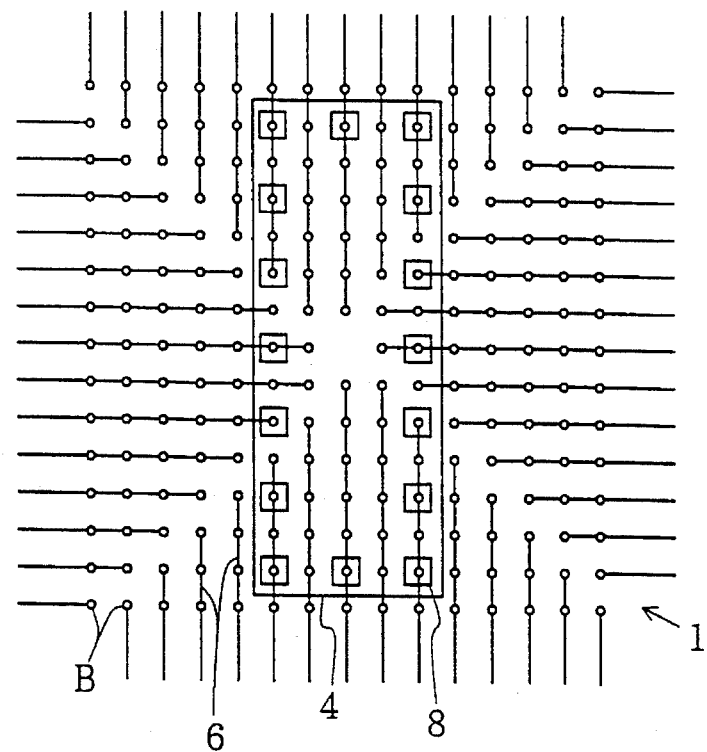
FIG. 6 is a diagram showing the alternative line patterns interconnecting electrodes probing a rectangular device.

FIG. 6 is a diagram showing the alternative line patterns interconnecting electrodes probing a rectangular device. A problem occurs that one line pattern 6 is connected with a plurality of terminals 8 when the LSI chip is rectangular as shown in FIG. 6. The same thing happens also when the LSI chip deviates from the center of the probe. Accordingly, it is desirable for all the line patterns 6 not to become parallel with the array direction (called a dicing line) of the terminals of the LSI chip 4, like the wiring shown in FIG. 4, in order to realize a more generalized film probe (except the center lines as seen from FIG. 4).

However, not only the center lines 6', but also wires inside the short sides of a possible smallest terminal pad area of the LSI chip 4 to be inspected may practically be parallel with the dicing lines. In this case, however, the center of the LSI chip 4 and that of the film probe 1 must coincide. Accordingly, if the measure is taken so that only the center lines 6' become parallel with the dicing lines as in the embodiment, the size of the LSI chip 4 may be disregarded and the center of the LSI chip 4 and that of the film probe 1 need not necessarily coincide. For the positioning of the LSI chip 4 and the film probe 1, the center of both need not necessarily coincide as described above as long as the center of the film probe 1 does not go outside of the pad area of the LSI chip 4.

Figure 7:
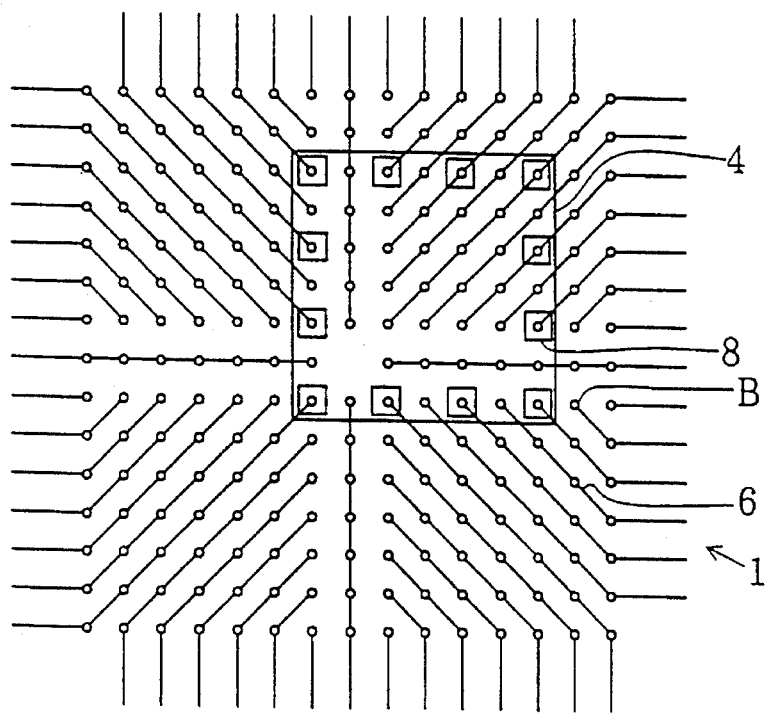
FIG. 7 is another detailed plan view further illustrating use of the probe of FIG. 1.

FIG. 7 is another detailed plan view further illustrating use of the probe of FIG. 1. In particular, FIG. 7 illustrates a positional relationship between the film probe 1 and the LSI chip 4 when their centers do not coincide. As seen from the figure, one probing column of the electrodes always corresponds with the terminal 8, one by one, in this case also. The fact that an inspection can be done even if the positional relationship between the LSI chip 4 and the film probe 1 is changed so long as they meet a certain requirement brings about such merits as follows.

That is, even if a certain probe electrode B is disabled due to a processing defect or abrasion, a probing may be carried out continuously without replacing the whole film when another probe electrode B is used by changing the position of the LSI chip 4. This brings about virtually the same effect, such that the life of the film probe 1 is prolonged. Then the life of the film probe 1 may be prolonged and the necessity of cleaning may be eliminated by regularly changing such position.

Figure 8:
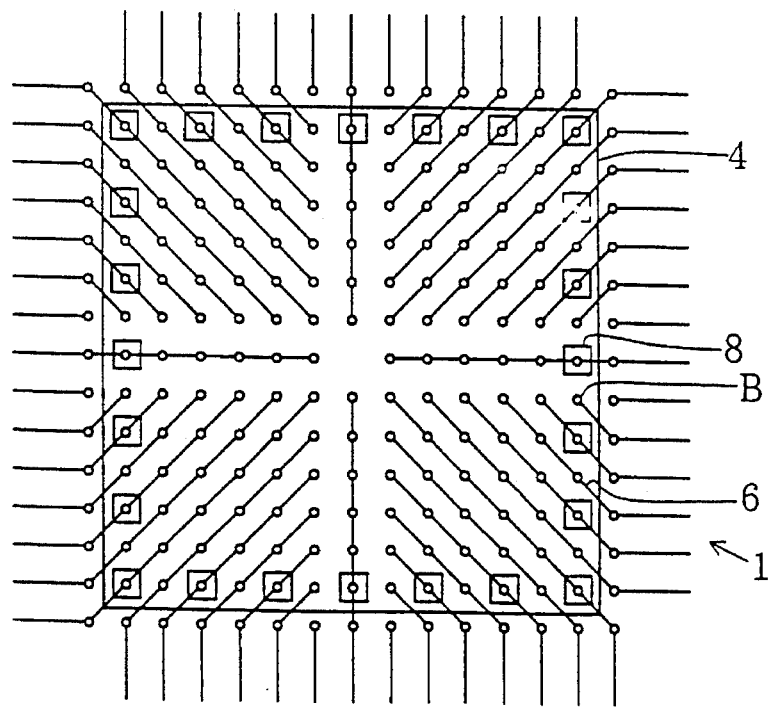
FIG. 8 is yet another detailed plan view further illustrating use of the probe of FIG. 1.
Figure 9:
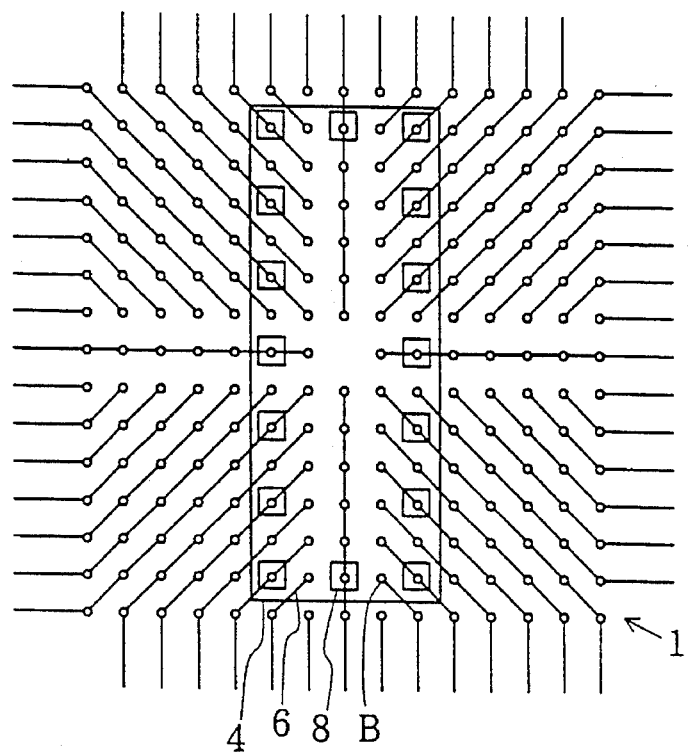
FIG. 9 is yet another detailed plan view further illustrating use of the probe of FIG. 1.
Figure 10:
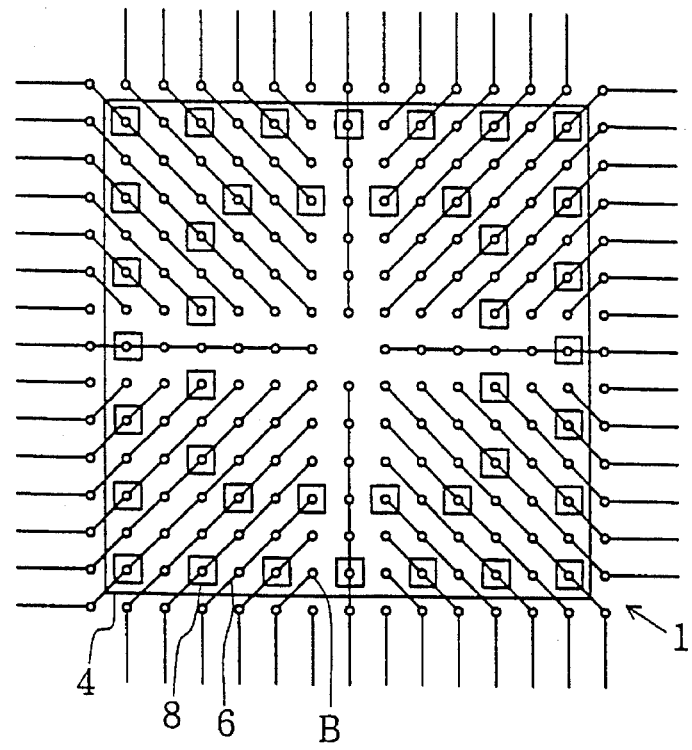
FIG. 10 is yet another detailed plan view further illustrating use of the probe of FIG. 1.

Referring now to FIG. 4, the fact that the probe of the present invention is applicable not only to certain LSI chips but also to most of present LSI chips will be explained. Most of LSI chips presently produced or announced adopt one row or zigzag two rows of terminals arrayed around the chip A width w of a terminal of most popular LSI chip presently produced is 100 micron and a minimum pitch p is 200 micron. Considering this fact, a pitch, P, of the probe electrodes B is set at 100 micron in the present embodiment so that the pitch, P, is equal to half the minimum pitch, P=p/2. FIGS. 8 through 10 show wiring states when the probe of the present invention is contacted and connected with various LSI chips. A size of the terminals 8 of the LSI chip 4 shown in those figures is 100×100 micron and a pitch is 200 micron.

FIG. 8 is yet another detailed plan view further illustrating use of the probe of FIG. 1. FIG. 8 shows a general LSI chip 4 close to a square and larger than that in FIG. 4. It can be seen from FIG. 8 that even if a size of the chip changes, one probing column of the electrodes always corresponds to the terminal 8, one by one.

FIG. 9 is yet another detailed plan view further illustrating use of the probe of FIG. 1. In particular, FIG. 9 shows a case when the chip is rectangular, and one probe electrode B and one line pattern 6 always correspond to one terminal 8 totally in the same manner with the case of the square. As described above, the wiring of the present invention allows to inspect favorably without being influenced by the size and shape of the LSI chip 4.

FIG. 10 is yet another detailed plan view further illustrating use of the probe of FIG. 1. As shown, the preferred embodiment can accommodate with device terminal pads arrayed in zigzags in two rows around the periphery as shown in FIG. 10, because the pitch between the probe electrodes is set at ½ of the minimum pitch (P=p/2).

Figure 11A:
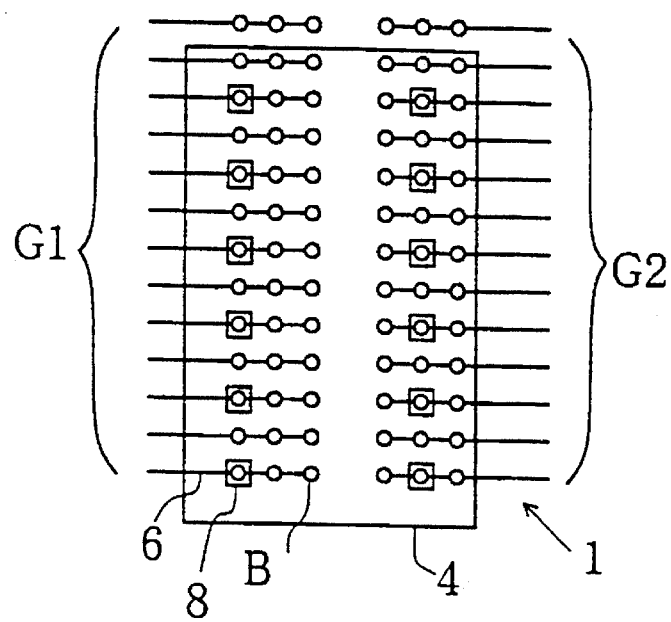
FIG. 11A is a detailed plan view of an alternative embodiment of the probe of the invention.
Figure 11B:
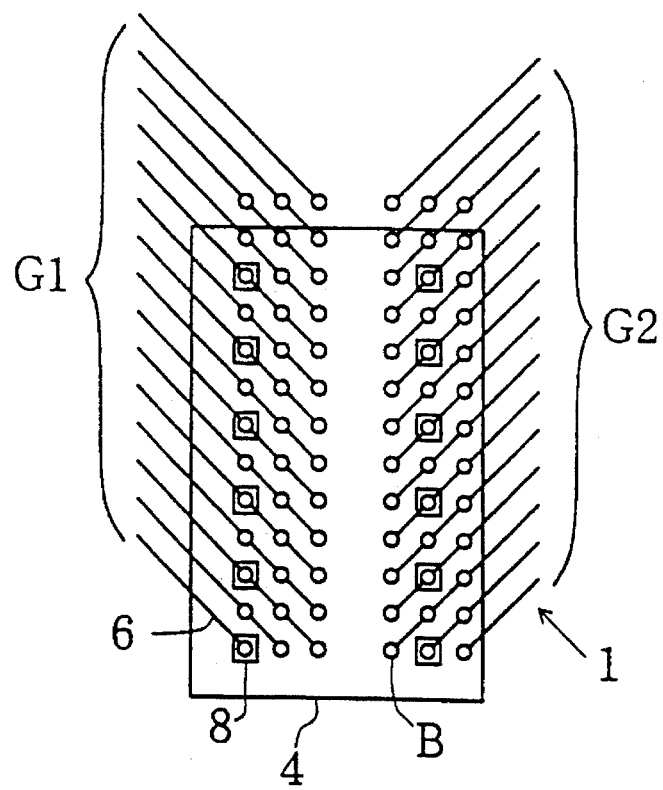
FIG. 11B is a detailed plan view of another alternative embodiment of the probe of the invention.

Next, additional examples of a method for specifying the aforementioned line pattern will be briefly explained. FIG. 11A is a detailed plan view of an alternative embodiment of the probe of the invention. FIG. 11B is a detailed plan view of another alternative embodiment of the probe of the invention. Normally the line patterns can be radiated in two directions as shown in FIGS. 11A and 11B in a case of film probe applied to a chip in which the terminals 8 are arrayed in two rows. In FIGS. 11A and 11B, one line pattern group G1 and the other line pattern group G2 are symmetrical mirror-wise (they are rotationally symmetrical by 180° in FIG. 11A).

Figure 12A:
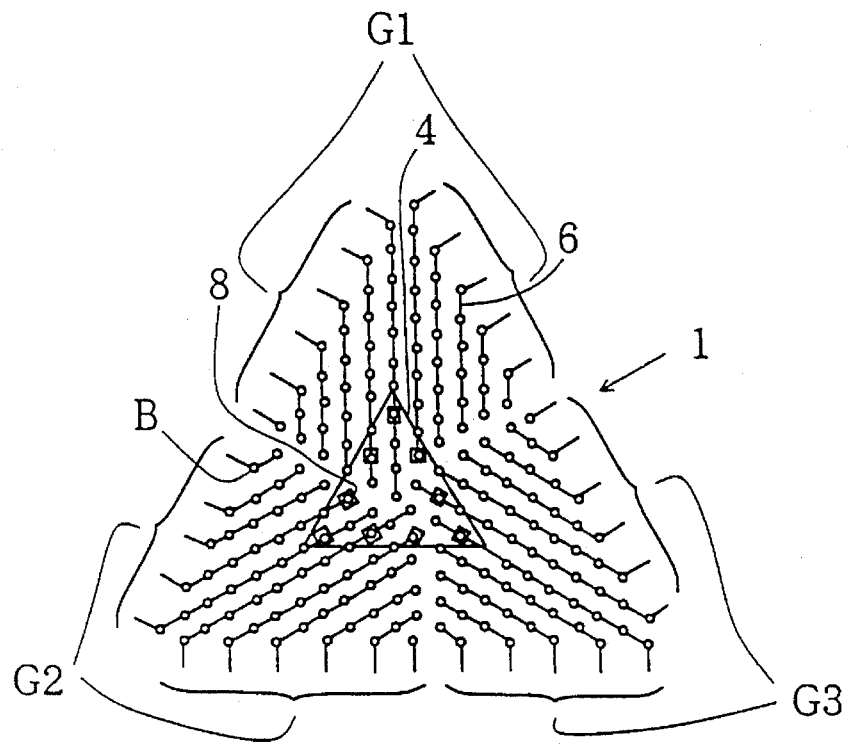
FIG. 12A is a detailed plan view of yet another alternative embodiment of the probe of the invention.
Figure 12B:
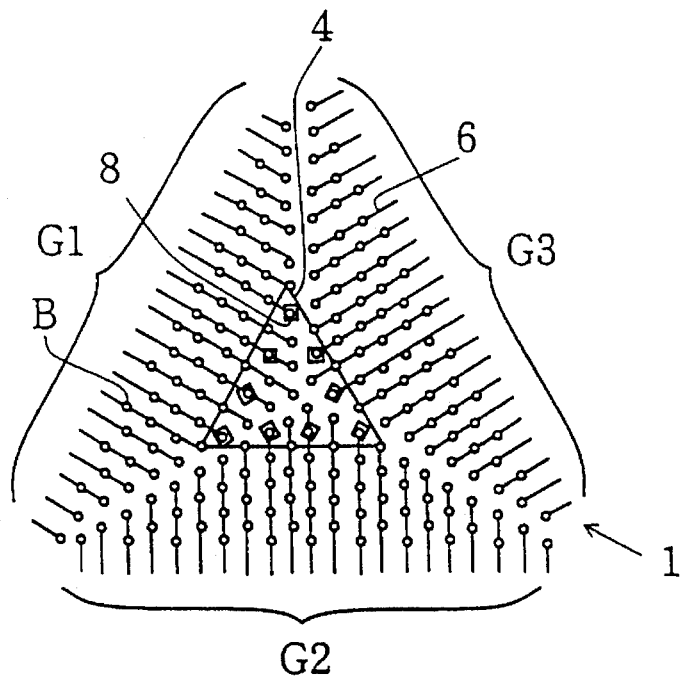
FIG. 12B is a detailed plan view of yet another alternative embodiment of the probe of the invention.

FIGS. 12A and 12b are detailed plan views of additional alternative embodiments of the probe of the invention. In a case of a film probe applied to a triangular chip in which the terminals 8 are arranged in a triangular form, the line patterns are normally radiated in three directions as shown in FIGS. 12A and 12B and three line pattern groups G1, G2 and G3 are placed in a relationship of rotational symmetry of 120° among each other. In a case of a film probe applied to a chip in which the terminals are arrayed in a square pattern, the line patterns are normally radiated in four directions like the film probes shown in FIGS. 3 through 10 and four line pattern groups G1 through G4 are placed in a relationship of rotational symmetry of 90° (a relationship that a group overlaps with other groups every time when it is rotated by 90°).

Figure 13:
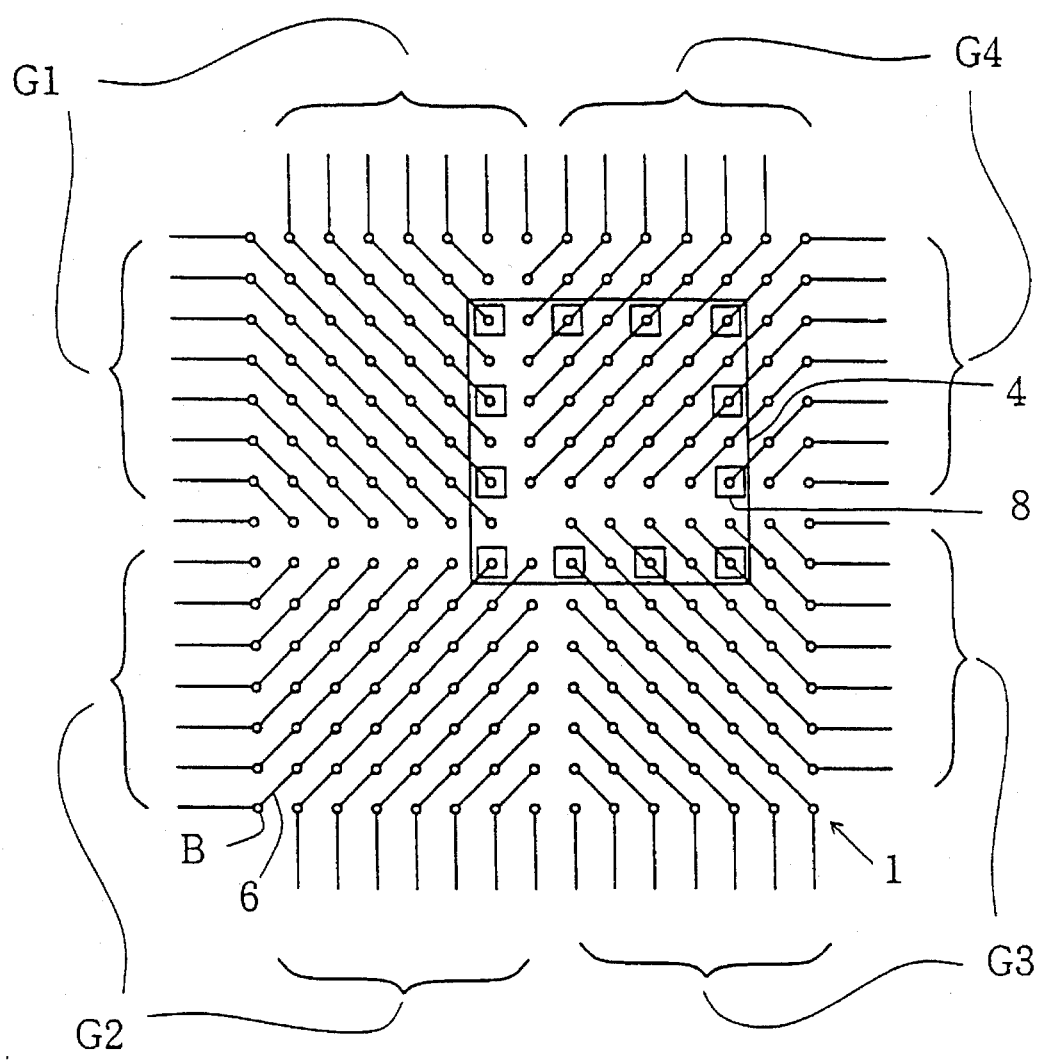
FIG. 13 is a detailed plan view of yet another alternative embodiment of the probe of the invention.

FIG. 13 is a detailed plan view of yet another alternative embodiment of the probe of the invention. The line patterns having such relationship of 90° of rotational symmetry may be arranged not only by the modes shown in FIG. 3 through 10, but also by four line pattern groups G1 through G4 as shown in FIG. 13.

Additionally, FIGS. 11A and 11B, FIGS. 12A and 12B and FIG. 13 show examples of arrangement of the terminals 8. As inferred from those figures, an arrangement in which the terminals 8 will not short each other may be selected by disposing the chip so that it always straddles the boundary portions of the line pattern groups.

According to data of academic societies (for example IEEE International Solid-state Circuits Conference 1990) and study results on LSI chips in the market, the size of the most pads is 100×100 micron and their pitch is integer times of the pad size. Accordingly, the probe can accommodate with most of the LSI chips if the probe electrodes are formed with a pitch of 100 micron. Further, because the probe electrodes are formed with a pitch of half of the minimum pitch, it is advantageous in handling high frequency and high speed signals. That is, it is effective in reducing cross-talk because a line pattern having no electric signal is disposed between two line patterns having electric signals.

Additionally, it is desirable to set the pitch between probe electrodes to be same with the pitch for a chip whose pitch is smaller than two times of a terminal pad size, though such chip is not being spread much. In this case, the same effect with those in the embodiment described above may be obtained except the reduction of cross-talk.

When the pitch between the probe electrodes is reduced to half or less than that as in the aforementioned embodiment, the effect is limited. Because more than two probe electrodes may contact with one pad in this case, more than two paths are created between the test system and a problem arises when high speed and high frequency signals are handled. The use may possibly be limited to measurement and test in direct current. However, such inconvenience can be solved by using a probe in which signal switching means is provided as described later herein.

Although the examples concerning LSI chips have been specifically discussed herein, wafers can be inspected using the teachings of the invention. Since the film probe closely attaches and corresponds with the irregular face, it can also be used for probing a packaged LSI device, chip parts and circuit substrate.

Currently, a pitch of terminals of packaged LSI devices is being narrowed. The number of device terminal pins is being increased more and more. Device terminals having less than 300 micron of pitch have appeared on the market. If a testing socket has to be made for each LSI chip, numerous problems arise. For example, it is difficult fabricate testing sockets to accommodate with such lead narrow pitch and associate costs are high. Similar problems arise in testing miniaturized chip parts and narrow pitch multi-pin circuit substrates. In particular, it has become a big problem how to build a simple probing method of a MCM in which a plurality of chips are mounted on one circuit substrate. Those problems, however, are solved by the film probe of the invention.

Figure 14:
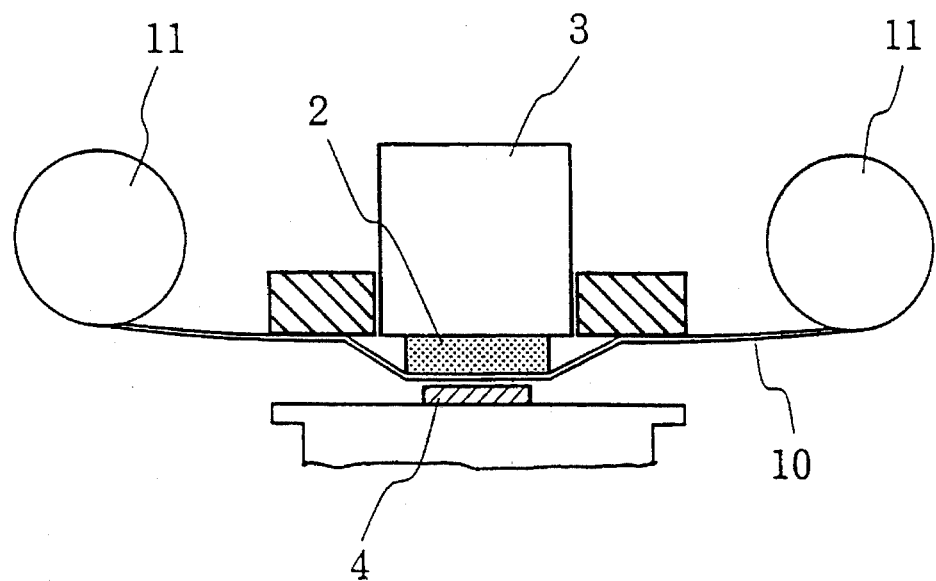
FIG. 14 is a drawing showing an embodiment that provides for ready replacement of a film probe.

FIG. 14 is a drawing showing an embodiment that provides for ready replacement of the film probe. The film probe 1 is formed into the same shape with a TAB tape to form a film probe tape 10. A pattern is formed repeatedly on the film probe tape 10 and guiding holes are created on both sides thereof. An adequate length of film probe tape 10 can be fed successively utilizing those holes. In the case of the embodiment shown in FIG. 14, the film probe tape 10 is wound around a reel 11 beforehand. A desired length of probe is fed from the reel while replacing the film probe. This method accommodates not only general terminal patterns, but also special patterns by providing a plurality of reels 11 or providing a plurality of types of patterns on the film probe tape 10. A prior art technology can be used for the connection between the film probe 1 and the inspecting apparatus, and a method disclosed in Japanese Patent Laid-Open No. 1-170870 may be used for example.

Figure 15:
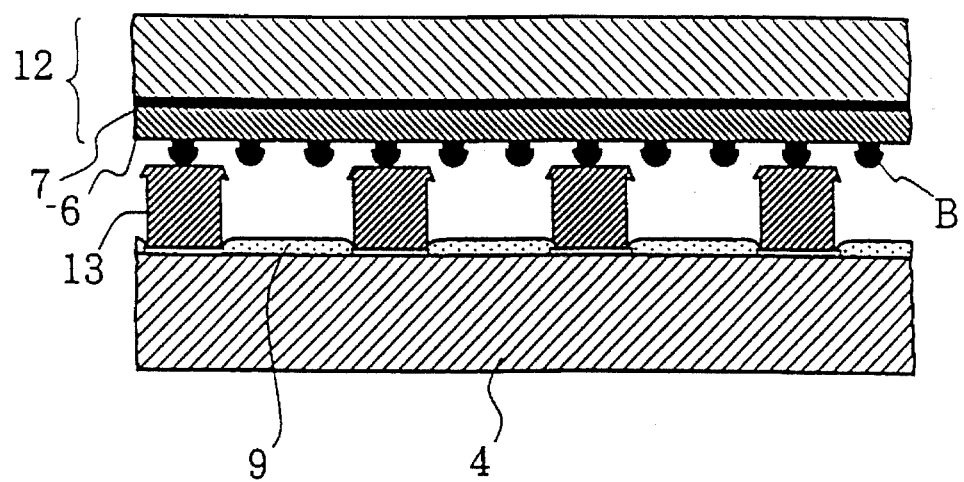
FIG. 15 is a detailed side view of yet another alternative embodiment of the probe of the invention.

FIG. 15 is a detailed side view of yet another alternative embodiment of the probe of the invention. A rigid circuit substrate 12 is used instead of the film probe made from a thin resin film such as polyimide film. Epoxy resin, ceramics, glass and silicon may be used for the material of the rigid circuit substrate 12. Epoxy resin has a merit that its cost is low and ceramics, glass and silicon have a merit that they allow fine wiring. Transparent glass has a merit that though it is difficult to wire in a multi-layer structure, a probing state may be readily observed. Because the rigid circuit substrate 12 cannot be flexibly deformed like a film, it is not suitable for the case when the terminals 8 are concave from the surface of the LSI chip 4 as shown in FIG. 2. However, it is effective when the height of the terminals 8 is higher than the surface of the LSI chip 4 as shown in FIG. 15. Further because fine wiring and multi-layer wiring can be readily implemented as compared to the film probe described before, it has a merit that it can accommodate with narrow pitch multi-pin devices.

A common factor of the film probe discussed previously herein and the rigid circuit substrate is that they both employ photolithographic technology. Such photolithographic technology includes both film forming technology and plating technology. These technologies are highly effective as compared to the conventional wire probe as means for refining wiring to accommodate with the narrow pitch multi-pin devices.

In semiconductor devices, a circuit is formed by laminating films such as silicon oxide and aluminum films on a silicon substrate. Those materials are suited for fine wiring because many of them are hardly deformed and are thin. However, there is a limit in the refining because the wires need to be thick to reduce wiring resistance and such resin as polyimide which is readily deformed is used as an insulating layer to match impedance in the probe. Because the substrate is made only by resin layers and is very readily deformed in the film probe, the width of line is limited to several tens of micron in reality. Moreover, even for the multi-layer wiring for accommodating with more complex circuits, it is the present situation that only two-layer wiring is generalized. Whereas that, the rigid circuit substrate allows not only to form lines with several micron of width but also to implement multi-layer wiring of several tens of layers if it is used in a manner of the present embodiment shown in FIG. 15.

As shown in FIG. 15, a semiconductor device having such protruding electrodes (indicated by the reference numeral 13 in the figure) includes chips for TAB (Tape Automated Bonding) and flip chip bonding. The chip for flip chip bonding is expected to be used for MCM (Multi Chip Module) and bumps made from a soldering material are formed often on terminals in semiconductor fabricating process. Although only the method shown in the prior art example can be applied for inspecting it presently, the embodiment of the present invention is very effective for that. On the other hand, the fact that the TAB scheme allow to inspect chips while packaging on the tape is considered to be one of advantages thereof and the tape is discarded together with probes when a failure occurs, so that bear chips are not inspected presently. However, this method cannot be considered to be the best because the cost of TAB tape itself increases as the number of I/Os of semiconductor increases. In fact, the TAB is applied only to those chips whose cost is fully higher than that of the tape. The application of TAB to lower cost chips will be accelerated if the present invention is applied to the chips for TAB because initial defective chips may be selected out before packaging on the tape.

Figure 16:
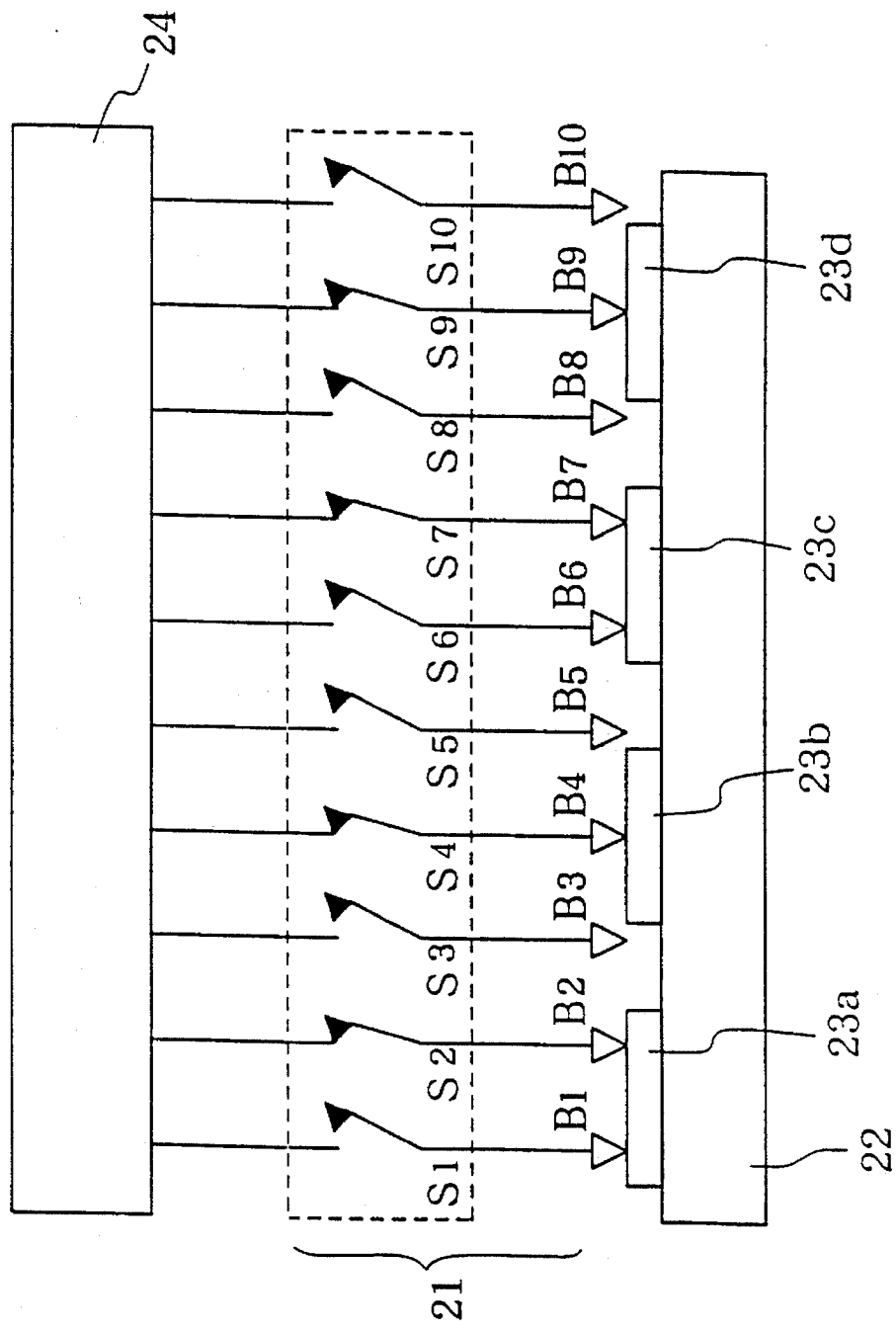
FIG. 16 is a schematic diagram illustrating an embodiment of a probe in which signal switching means are provided.

FIG. 16 is a schematic diagram illustrating an embodiment of a probe in which signal switching means are provided. In the figure, a probe 21 comprises a plurality of probe electrodes (these are not confined to such contact bumps as described before in this embodiment) B1 through B10 and signal path switching means (switches S1 through S10 in this case) connected to each of those electrodes. The probe electrodes B1 through B10 are contacted with terminal pad faces (terminals 23a through 23d) of a device to be probed (a LSI chip 22 in this case) and terminals on the other side of the switches S1 through S10 from the side where the probe electrodes are connected to the main body of inspecting apparatus 24.

A pitch b of the probe electrodes B1 through B10 is narrower than a width of the terminals 23a through 23d (i.e. b≦w) and more than one probe electrodes contact with one terminal. In the example of the figure, two probe electrodes B1 and B2 and B6 and B7 are connected to the terminals 23a and 23c respectively and one probe electrode B4 and B9 are connected to the other terminals 23b and 23d respectively.

Further, among the switches S1, S2, S6 and S7 connected respectively to the terminals 23a and 23c, the switches S2 and S7 are closed and S4 and S9 are opened, respectively. The switches S4 and S9 connected to the terminals 23b and 23d are closed, respectively. The inspecting apparatus 24 can form one signal path which is connected to each of four terminals 23a through 23d by closing the switches S2, S4, S7 and S9. The present embodiment allows to send and receive test signals between the inspecting apparatus 24 and the LSI chip 22 by switching the switches S1 through S10 as described above regardless of the arrangement of the terminals 23a through 23d.

Because the purpose of the switches S1 through S10 provided in the probe 21 is to singularize the signals path from the terminals 23a through 23d, only the switch connected to either one of probe electrodes conducts when more than two probe electrodes contact with one terminal.

Additionally, the switches S3, S5, S8 and S10 which are connected to probe electrodes (B3, B5, B8 and B10 in FIG. 16) which do not contact with the terminals 23a through 23d may be closed or opened by another reason from the present invention.

Figure 17:
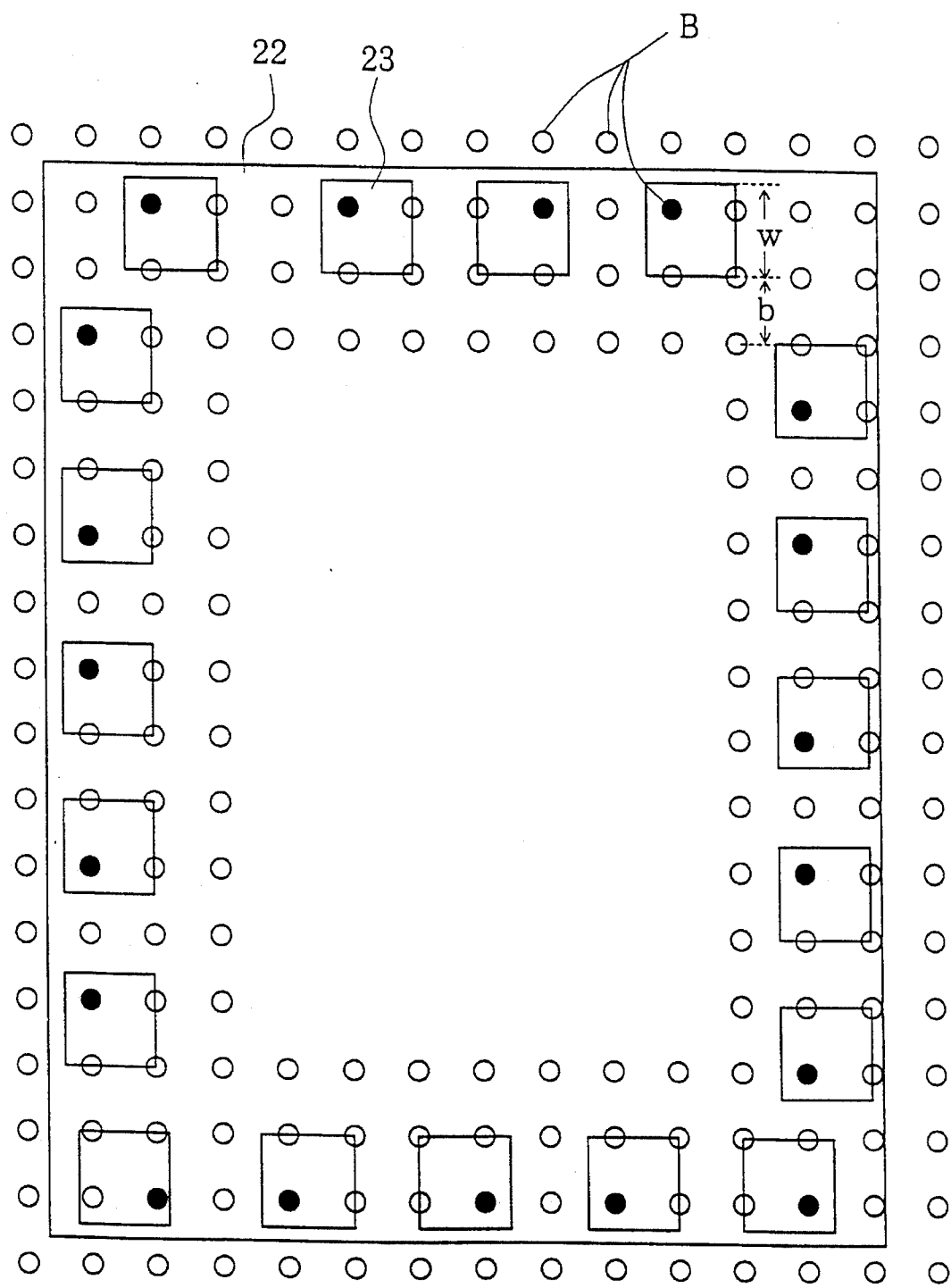
FIG. 17 is a detailed plan view of the probe of schematically illustrated in FIG. 16.

FIG. 17 is a detailed plan view of the probe of schematically illustrated in FIG. 16. FIG. 17 is a diagram for explaining the probe shown in FIG. 16 by expanding it into the two-dimensional diagram wherein a positional relationship between the terminals 23 of the LSI chip 22 and the probe electrodes B is more clearly shown. In the figure, a number of probe electrodes B are arranged in a grid pattern at equal intervals horizontally and vertically on the upper surface of the LSI chip 22 and parts thereof contact with the square terminals 23. As compared to the width w of the terminal 23, the probe electrodes B are arranged in a narrow pitch b and more than two probe electrodes B contact with one terminal 23.

In the figure, the terminals 23 are connected with the main body of the inspecting apparatus via the probe electrodes B indicated by black circles. Accordingly, the switches connected to the probe electrodes B indicated by black circle are closed and the other switches connected to the probe electrodes B indicated by white circle are opened.

In this embodiment, the probe electrodes B which contact with the terminals 23 need to be specified to open/close the switches. Normally, information on a shape of the LSI chip 22 and position and shape of the terminal 23 formed on such device can be obtained from data for CAD (Computer Aided Design) used in designing the LSI chip 22 and can be known by collating such information and the known positional information of the probe electrodes B.

Figure 18:
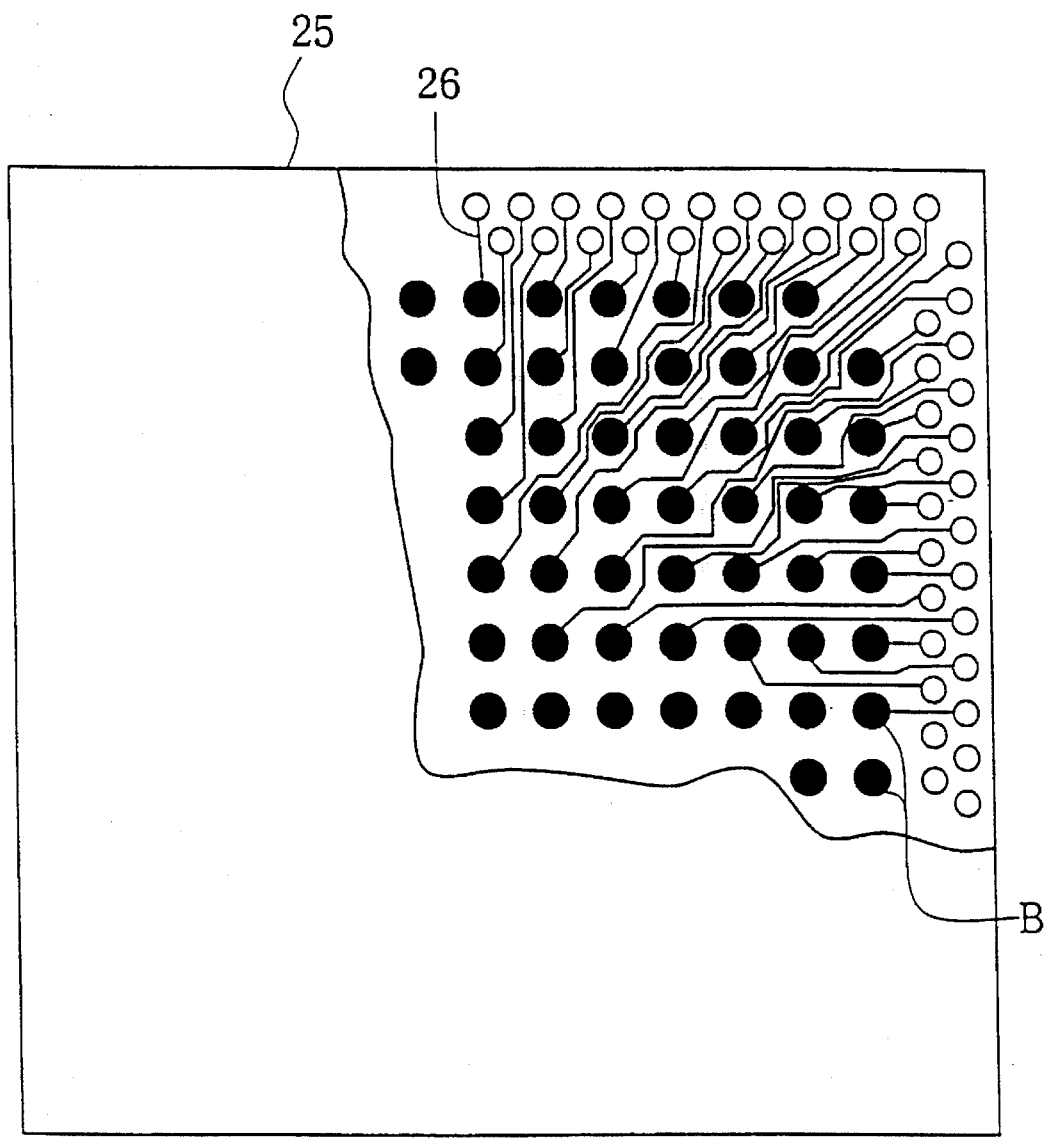
FIG. 18 is a detailed plan view of yet another embodiment of the probe of the invention.

FIG. 18 is a detailed plan view of yet another embodiment of the probe of the invention. As shown, a probe 25 in which the probe electrodes B are arranged in a grid pattern corresponding to a face on which electrodes are formed on the LSI chip, which may be used for terminals arrayed in a matrix pattern across the whole area on one face of the LSI chip (so called an area array). In this probe 25, each wire lead out from each probe electrode B is connected with the main body of the inspecting apparatus via a corresponding switch and each switch may conduct or shut off the signal path by opening/closing it.

Additionally, a switch may be provided in each radial line shown in FIGS. 1 through 15. As described above, in the embodiments shown in FIGS. 1 through 15, only a desired signal path may be conducted by opening/closing each switch when probe electrodes of more than two lines contact with one terminal.

For the shape of probe shown in the aforementioned embodiments, either wire probe or film probe may be adopted in a test of DC characteristics. However, the film probe which has a small self-inductance may be favorably used in a test of high frequency characteristics. For example, a probe excellent in high frequency characteristics may be provided by constructing transmission lines which are led out from the probe electrodes B (contact bumps in this case) to around the probe by micro-strip lines 26.

Now the switches used in the present embodiment will be explained in detail. As exemplified in FIG. 16, the purpose of the switches S1 through S10 is to select signals from the probe electrodes B contacted with the terminals 23a through 23d. It is of course desirable for the electrical characteristics required for the switches S1 through S10 to be better than that of the LSI chip 22.

The switches need to be switched only when a type of the LSI chip 22 is replaced, and the same switching state may be kept while the same kind of test is carried out. Due thereto, the switching time required for opening/closing the switches needs not necessarily be fast. Accordingly, reed relays having small leakage current may be used for the switches for the probe used in a test of DC characteristics.

Further, when the probe just needs to be applied for the same kind of tests, a meltable material (such as a fuse that melts when an excessive current flows therethrough) which can open/close the signal path by melting itself may be used as the signal path switching means for the corresponding switch portions. Thereby only desired probe electrodes and the inspecting apparatus may be connected by cutting connections between other probe electrodes not necessary and the inspecting apparatus beforehand by feeding an excessive current or irradiating laser light to the aforementioned corresponding switch portions.

A lower cost probe whose manufacturing process is by far easy as compared to the probe manufactured manually for each type of semiconductor device may be provided by constructing it so that the signal path switching means can be melted to shut off the signal path.

Because the same number of switching means with that of the probe electrodes are necessary in the present embodiment, semiconductor switches such as MOSFET and JFET are suitable as the switching means from the aspects of miniaturization and reliability.

A distance from the signal path switching means to the probe electrode is important in the high frequency test. This will be explained noticing on the switches S1 and S2 connected to two probe electrodes B1 and B2 for example which contact with the terminal 23 in FIG. 16.

When a test signal from the inspecting apparatus 24 arrives the terminal 23a passing through the switch S2, the distance from the probe electrode B2 to the opened switch S1 determines its frequency characteristics. That is, when a propagation time which the test signal from the inspecting apparatus 24 takes to arrive to the switch 24 passing through the terminal 23b is not negligible, a waveform reflected at the opened section of the switch S1 passes through the terminal 23a again and arrives at the inspecting apparatus 24. Due thereto, the waveform is distorted when the test signal is a pulse waveform.

A relationship between the aforementioned propagation time and the frequency characteristics will be now explained in more detail using mathematical expressions.

Where a dielectric constant around a line from the probe electrode B1 to the switch S1 is epsilon $_{eff}$ and light velocity is $c_o$ (3.0×10$^8$ m/s), a propagation speed of the test signal $v_o$ may be expressed as:

$$v_o = c_o/(\text{epsilon}_{eff})^{1/2}$$

A distance L which the signal having the propagation speed of $v_o$ propagates in a propagation time t is expressed as:

$$L = t*v_o = t*c_o/(\text{epsilon}_{eff})^{1/2}$$

Here, a rise time of the pulse waveform is $t_r$, the relationship with the cut-off frequency $f_c$ may be expressed as:

$$t_r = 0.35/f_c$$

When the propagating time of the pulse waveform having a rise time of $t_r$ is negligible and may be considered as a lumped constant t', it is expressed as:

$$t' = t_r/2$$

By substituting the relationships of Expressions 5 and 6 for Expression 4, a propagation distance L' through which the time for the waveform having the rise time of $t_r$ to pass can be considered as a lump constant may be expressed as:

$$L' = (0.35/2)*(c_o f_c)/(\text{epsilon}_{eff})^{1/2}$$

For example, when a pulse waveform having a rise time of 350 ps propagates a signal path surrounded by a dielectric body of polyimide (epsilon $_{eff}$ =3.5), the propagation distance L' in which no reflection is caused because the path can be considered as a lump constant is found to be less than 2.8 cm from Expression 9.

Figure 19:
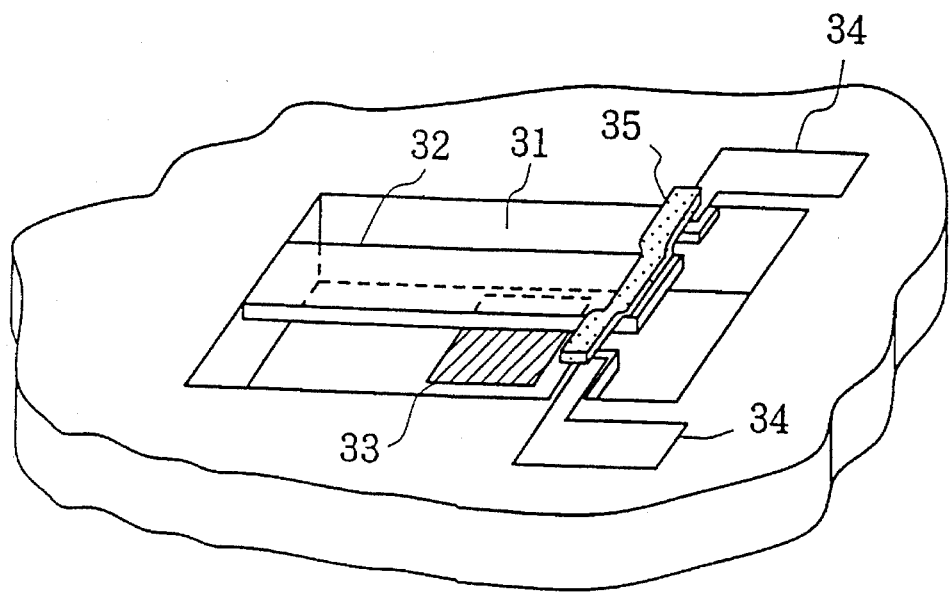
FIG. 19 is a detailed perspective view of a micro-machined switch of the alternative embodiment of the probe of the invention.

The aforementioned switches can be manufactured using also micro-machining technology. FIG. 19 is a detailed perspective view of a micro-machined switch of the alternative embodiment of the probe of the invention. FIG. 19 shows a switch fabricated on a silicon substrate. In the figure, a cantilever 32 is formed above a grove 31 created on the substrate and a driving electrode 33 is formed on the bottom of the groove 31. A wing shaped contact member 35 is provided vertically to the longitudinal direction of the cantilever 32 at the end of the cantilever 32 so that it will not contact with a pair of signal electrodes 34 formed on the substrate in a non-driven state and the signal electrodes 34 are switched by the contact member 35.

In this switch, the cantilever 32 is sectioned downwardly by electrostatic force when a voltage is applied between the cantilever 32 and the driving electrode 33. Thereby, the contact member 35 and the signal electrodes 34 contact, closing both signal electrodes.

This type of switch has such merits that a leak current is very small as compared to that of semiconductor switches because it has a mechanical structure and that it is excellent in terms of high frequency characteristics because it is small. Because it has been reported that the cantilever 32 can be fabricated in such a small size of about 150 micron in length and 80 micron in width, it is easy to form about 1000 switches for example on a silicon substrate of several cm square. Thereby, the distance from the probe electrode B1 to the switch S1 may be designed to be less than several cm and a probe having a band width of several GHz may be realized.

Figure 20:
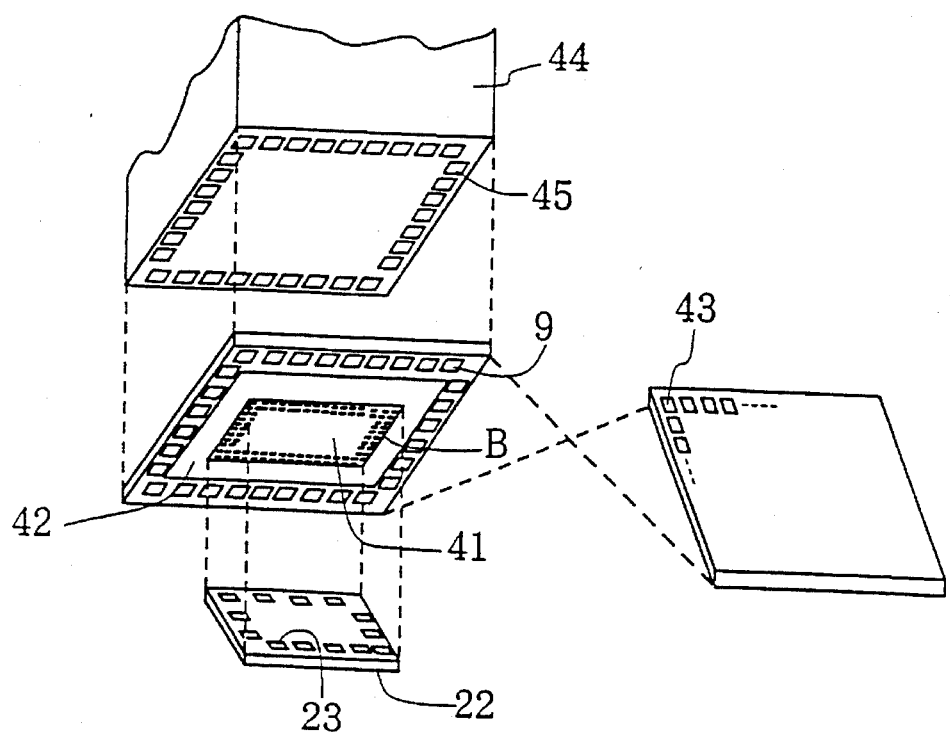
FIG. 20 is a drawing showing an embodiment of a probe in which the switch shown in FIG. 19 is applied.

FIG. 20 shows one example of a probe in which the switch shown in FIG. 19 is applied. In the figure, the switch shown in FIG. 19 (a switch forming area 42 in FIG. 20) is formed around probe electrodes B formed on a silicon substrate 41. The probe electrodes B are arrayed in a grid pattern similarly to those shown in FIG. 18 for example. Each switch and probe electrode B are wired on the silicon substrate 41. Thereby, a distance between the probe electrode B and the switch formed in the switch forming area 42 can be less than several cm.

The probe electrodes B formed on the silicon substrate 41 are electrically connected with the main body of inspecting apparatus via contact points 43 formed on the surface opposite from the silicon substrate 41 and contact points 45 formed on the bottom face of a main body of probe 44. When they are connected, a pressure necessary for pressing the probe electrodes B to the terminal 23 of the LSI chip 22 is applied by the main body of probe 44.

Additionally, although the switches fabricated by micro-machining are used in the example in FIG. 20, it is possible to integrate and form semiconductor switches using MOSFET or JFET on the substrate (for example on the area 42 formed by switch means).

Figure 21:
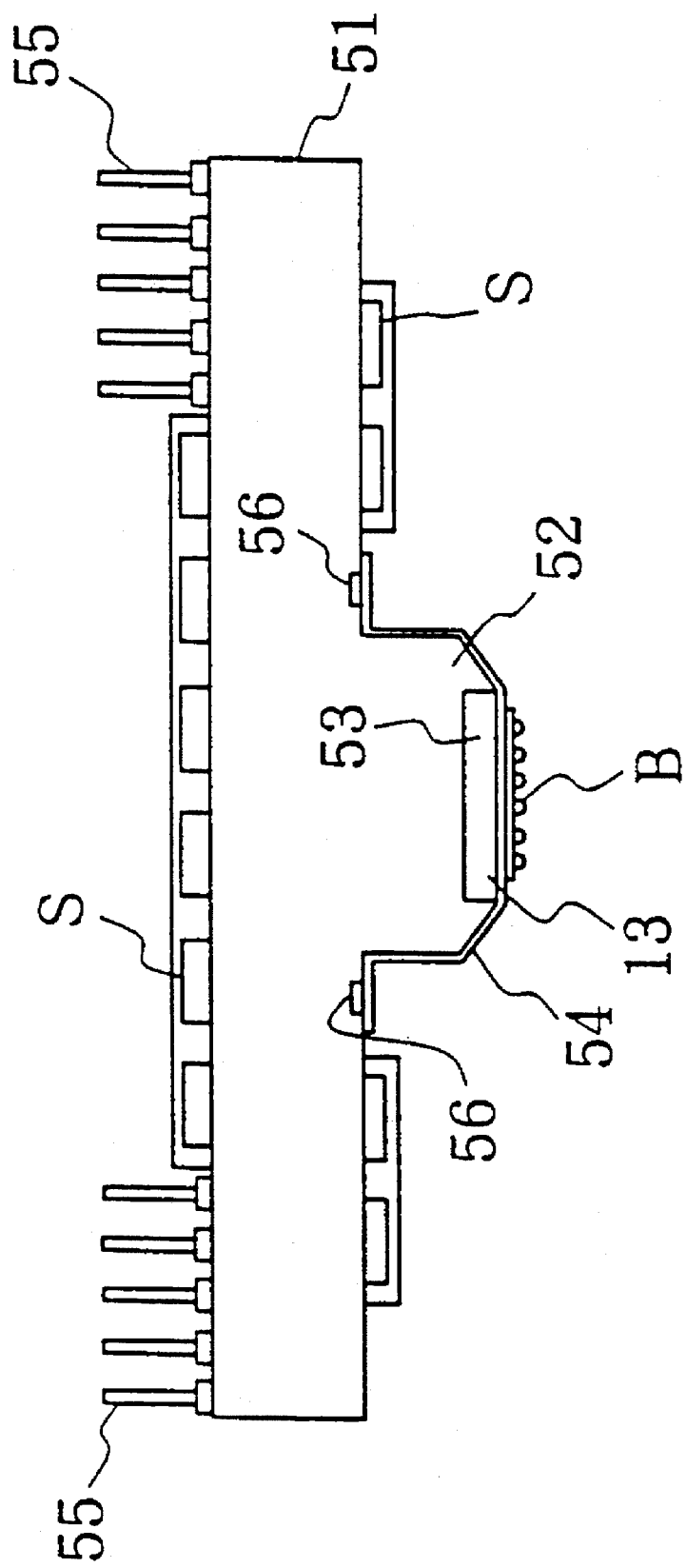
FIG. 21 is a side view of yet another alternative embodiment of the probe of the invention.

FIG. 21 is a side view of yet another alternative embodiment of the probe of the invention. As shown, the probe includes a thin film of polyimide or the like, wherein projecting electrodes (contact bumps here) which are probe electrodes are formed on one surface. In the probe of the figure, an elastic body 53 made from silicone rubber is embedded in the middle of a projecting portion 52 formed in the center portion of a probe body 51 having a ceramic multi-layer wiring structure and a film probe 54 is provided on the elastic body 53. On the film probe 54, probe electrodes B having a grid array are formed on the outside surface thereof and line patterns (not shown) are led out from the probe electrodes B to the edge of four sides of the film probe 54 to conduct to terminals formed on the back of the film probe 54. Because the ceramic substrate allows to reduce a dielectric constant by using a glass type material having a low dielectric constant or polyimide film material, the distance L necessary for obtaining the same frequency band can be prolonged in Expression 9 and a high density wiring is possible.

Switches S are formed around the projecting portion 52 on the surface of the probe body 51 and on the back thereof. A number of pins 55 for electrically connecting with the inspecting apparatus are formed from the back (upper surface) of the probe body 51. Terminals 56 are formed around the projecting portion 52. The projecting electrodes B are connected to the switches S via wires formed in multi-layer (not shown) on the terminals on the back and surface 56 around the edge of the film probe 54.

With this probe, the elastic body 43 absorbs the irregularity on the surface of terminals and achieves a good contact when the film probe 54 provided on the projecting portion 52 is pressed to the terminals of a LSI chip.

Further, because the distance between the projecting electrodes B and the switches S can be set short (i.e., the condition of Expression 9 can be met), a problem caused by the reflection of test signals can be prevented from occurring. Switches described previously herein (i.e. MOSFET, JFET and cantilever by micro-machining technology) can be used for the switches S.

Normally, the same number of signal sources with that of projecting electrodes are required so that those signal sources can be switched in various ways even if any signal sources are connected to any terminals in the inspecting apparatus connected to the probe described above. Accordingly, so-called a per-pin resource system inspecting apparatus which allows to set conditions of the signal sources independently is particularly suitable.

Figure 22:
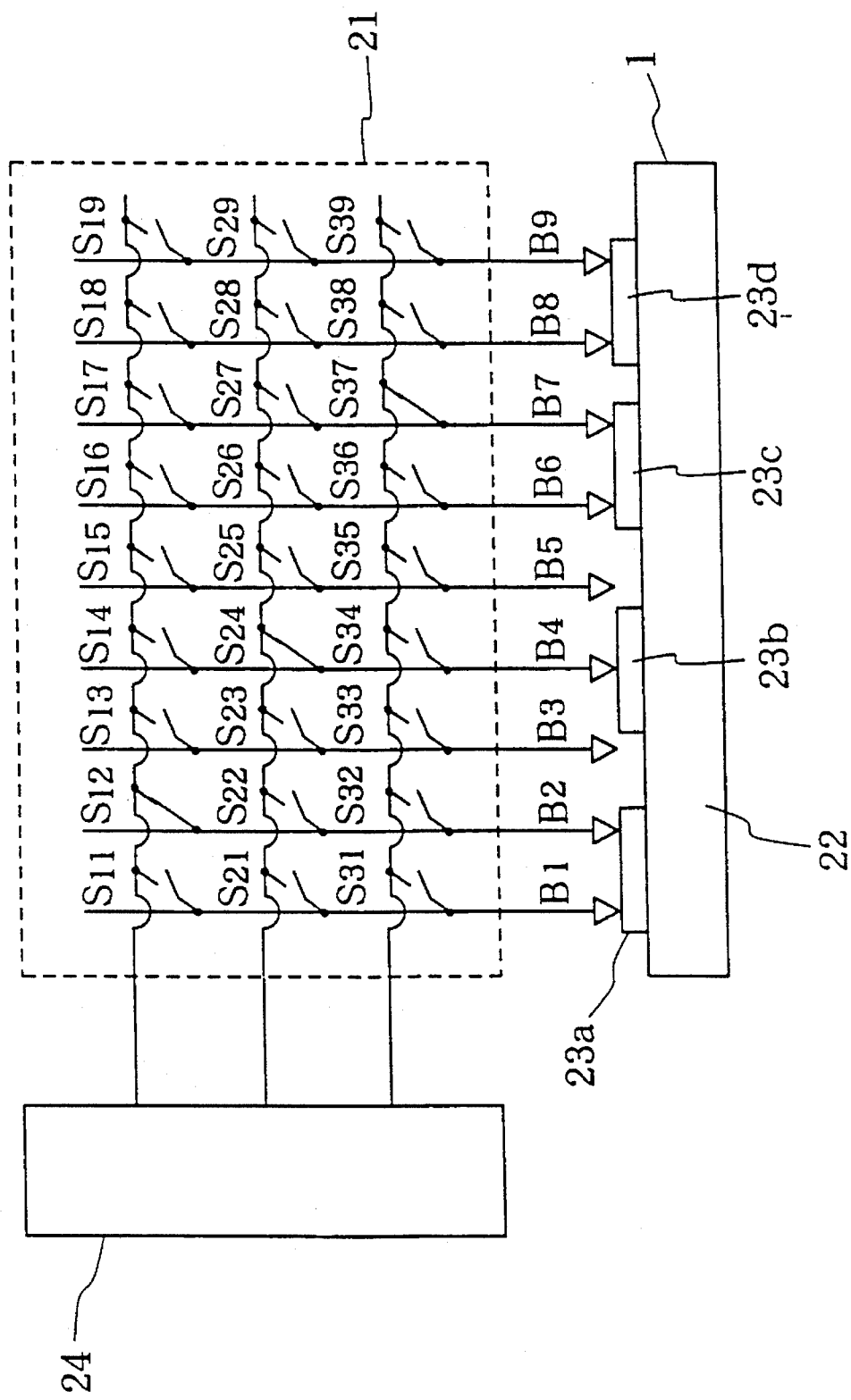
FIG. 22 is a schematic diagram illustrating an embodiment of a probe using a matrix type switch as the signal path switching means.
Figure 23:
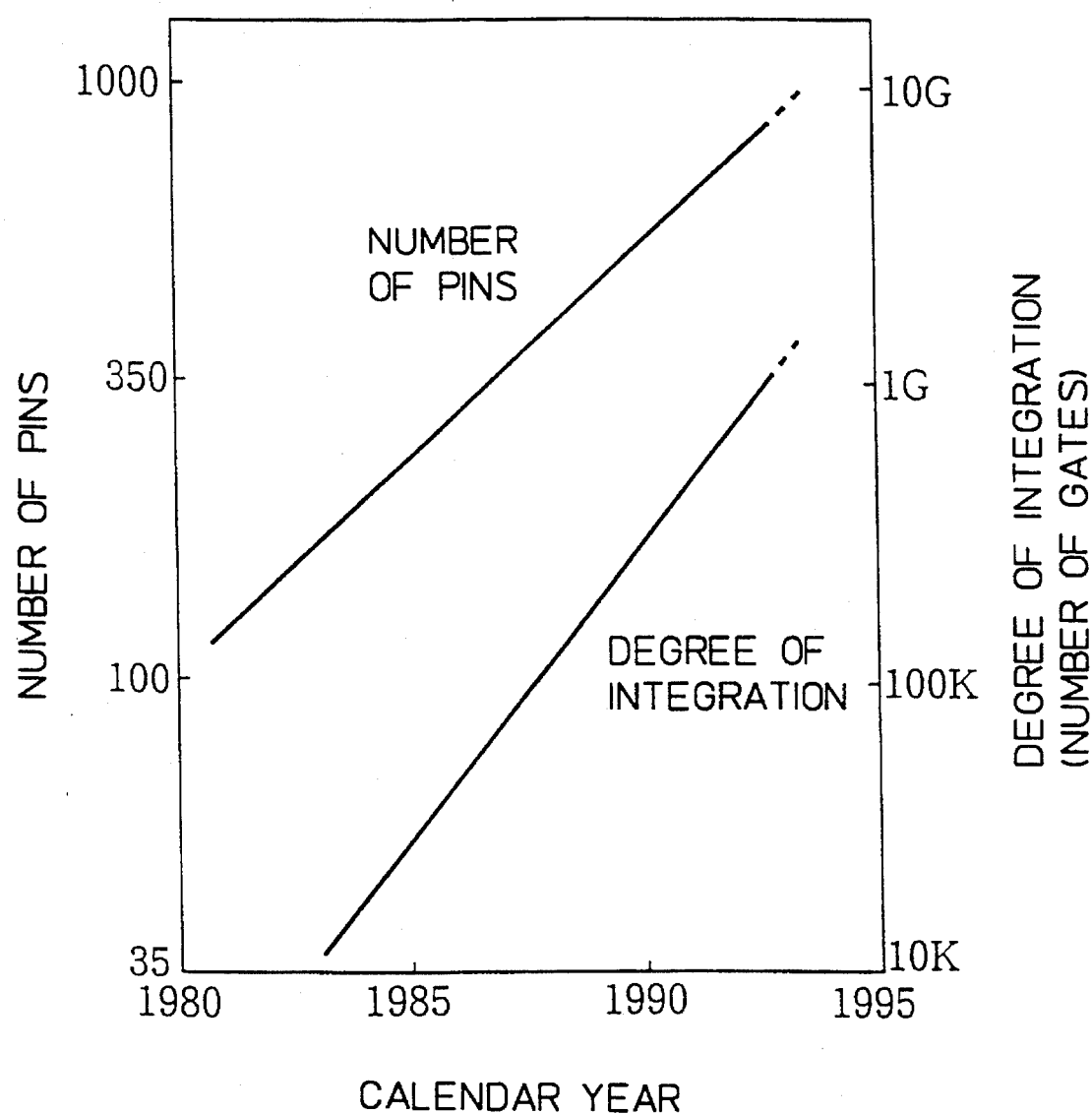
FIG. 23 shows an LSI having more than a 1000 pins as shown in the prior.

FIG. 22 is a schematic diagram illustrating an embodiment of a probe using a matrix type switch as the signal path switching means. The probe shown in FIG. 22 differs from the probe shown in FIG. 16 in that while the latter has one switch for each of the probe electrodes B1 through B9 as the signal path switching means, the former uses so-called a matrix type switches Sij (i=1, 2, 3, j=1, 2 . . . ,9) instead of the latter.

In FIG. 22, the switches S12, S24 and S37 are closed to electrically connect with the terminals 23a through 23d and other switches are opened. Here, signals of three terminals 23a through 23c can be inspected using three signal sources. Thus the use of the probe in FIG. 22 allows to inspect semiconductor devices using the inspecting apparatus 24 having the same number of signal sources with that of terminals. Accordingly, the probe using this matrix type switch is favorably used when the inspecting apparatus is relatively small.

Although the switches Sij are arrayed in the two-dimensional matrix because the probe electrodes B1 through B9 are arrayed in one dimension in FIG. 22, the switches are arrayed in a three-dimensional matrix when the probe electrodes are arrayed in two-dimension.

In view of the previous discussions herein, it should now be clear that the present invention has the following effects:

(1) The probe of the present invention can accommodate with semiconductor devices such as most present LSI chips in which device terminals such as terminal pads or terminal pins are formed so as to meet a certain rule, so that the film probe needs not be reformed for each semiconductor device corresponding to changes of position and size of the pads and changes of size of the chips.

Accordingly, its cost is low as compared to those of the conventional wire and membrane probes. Furthermore, because it is fabricated using photolithographic technology, it can accommodate with multi-pin narrow pitch semiconductor devices and can compensate its low durability by allowing to replace the film probe.

(2) In contrast to conventional probes, the construction of the probe can be modified by electrical or programmable means. Thereby, the probe needs not be replaced every time when a type of a device to be probed is changed and signals can be transmitted and received with various objects to be contacted by one probe.

(3) Not only a time necessary for fabricating the probe, but also a time necessary for such steps as mounting can be reduced. Accordingly, it is suited as a probe used in producing various kinds of items in small quantity such as ASIC.

(4) A probe having an excellent high frequency characteristics as compared to the conventional wire probe is be provided.

(5) The excellent general purpose quality of the present invention and the realization of low cost probe promote uniform device terminal arrays in semiconductor devices and provide economic advantages.

(6) Several kinds of devices (chips) may be mounted on the same carrier by diverting the film probe of the present invention to the carrier of TAB.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An apparatus for probing semiconductor devices having terminal comprising:

a substrate (1) having a surface;

probe electrodes (B) disposed on the surface of the substrate, wherein the electrodes are arranged on the surface of the substrate in a plurality of columns for probing the semiconductor device, each probing column extending outwardly from a central portion of the substrate surface towards a perimeter of the substrate surface; and means (6; S1–S10; S) for electrically coupling probe electrodes with a test system in such a way so as to provide the devices to be probed with a selection of more than two arrangements in which device terminals contacting the probe electrodes are not shorted with each other by the coupling means, wherein the coupling means includes a plurality of line patterns (6), each line electrically interconnecting the electrode of a respective one of the probing columns, wherein the probe electrodes are arrayed in a grid pattern at contacting regions with the device to be probed by a signal path switching means (S1-S10; S), and wherein said probe electrode and signal path switching means are both formed on the substrate.

2. An apparatus as in claim 1 further comprising:

means (3) for aligning the electrodes disposed on the substrate surface with the device terminals so as to select a respective probing column for each terminal of the device; and means (2) for pressing a respective selected electrode into electrical contact with each terminal of the device, so as to provide electrical coupling between each device terminal and the respective selected probing column.

3. An apparatus as in claim 1 wherein said signal path switching means is a semiconductor switch or a mechanical switch (31, 32, 33, 34, 35) fabricated by a micro-machining technology.

4. An apparatus as in claim 1 wherein said signal path switching means is constructed so that it opens a signal path by melting.

5. An apparatus as in claims 1 wherein the substrate comprises an insulative flexible synthetic resin film having a front surface coupled with the electrodes.

6. An apparatus as in claim 5, further comprising an elastic body mechanically coupled with a rear surface of the insulative flexible synthetic resin film.

* * * * *